(12) United States Patent
Scott et al.

(10) Patent No.: US 10,447,344 B2
(45) Date of Patent: Oct. 15, 2019

(54) RF BRANCH WITH ACCELERATED TURN-ON AND HIGH Q VALUE

(71) Applicant: Qorvo US, Inc., Greensboro, NC (US)

(72) Inventors: Baker Scott, San Jose, CA (US); George Maxim, Saratoga, CA (US); Dirk Robert Walter Leipold, San Jose, CA (US); Eric K. Bolton, Kernersville, NC (US); Daniel Charles Kerr, Oak Ridge, NC (US); Hideya Oshima, Santa Clara, CA (US)

(73) Assignee: Qorvo US, Inc., Greensboro, NC (US)

( * ) Notice: Subject to any disclaimer, the term of this patent is extended or adjusted under 35 U.S.C. 154(b) by 108 days.

(21) Appl. No.: 15/401,936

(22) Filed: Jan. 9, 2017

(65) Prior Publication Data
US 2017/0201245 A1    Jul. 13, 2017

Related U.S. Application Data

(60) Provisional application No. 62/363,536, filed on Jul. 18, 2016, provisional application No. 62/362,818, (Continued)

(51) Int. Cl.
*H04B 3/54* (2006.01)
*H03K 17/0412* (2006.01)
*H03K 17/693* (2006.01)

(52) U.S. Cl.
CPC ....... *H04B 3/548* (2013.01); *H03K 17/04123* (2013.01); *H03K 17/693* (2013.01)

(58) Field of Classification Search
CPC ................. H01L 27/1203; H01L 23/66; H01L 2924/00014; H03K 17/04123;
(Continued)

(56) References Cited

U.S. PATENT DOCUMENTS 7,345,521 B2   3/2008  Takahashi et al.
7,459,988 B1   12/2008 Iversen
(Continued)

OTHER PUBLICATIONS

Non-Final Office Action for U.S. Appl. No. 15/585,345, dated Feb. 23, 2018, 5 pages.
(Continued)

*Primary Examiner* — Lincoln D Donovan
*Assistant Examiner* — Diana J. Cheng
(74) *Attorney, Agent, or Firm* — Withrow & Terranova, P.L.L.C.

(57) ABSTRACT

Improved Radio Frequency (RF) switches are provided herein. According to one aspect, an RF switch comprises one or more stages. In one embodiment, each stage comprises a signal input terminal, a signal output terminal, a control input terminal, and a switching device having a first terminal connected to the signal input terminal, a second terminal connected to the signal output terminal, and a third terminal for controlling the on/off state of the switching device. Each stage includes a first resistor connected in series between the control input terminal and the third terminal, a first bypass switch for electrically bypassing the first resistor, and a second resistor connected in series between the signal input terminal and the signal output terminal. The first resistors form a first bias network, the second resistors form a second bias network, and the switching devices are connected in series.

19 Claims, 21 Drawing Sheets

Related U.S. Application Data filed on Jul. 15, 2016, provisional application No. 62/276,421, filed on Jan. 8, 2016.

(58) Field of Classification Search
CPC .. H03K 17/063; H03K 17/102; H03K 17/122; H03K 17/161; H03K 17/162; H03K 17/687; H03K 17/693; H03K 2217/0018; H03K 2217/0054
USPC ............... 326/30; 327/374–377, 379, 384
See application file for complete search history.

(56) References Cited

U.S. PATENT DOCUMENTS

| | | | |
|---|---|---|---|
| 8,373,490 B2 | 2/2013 | Burgener et al. | |
| 8,461,903 B1 | 6/2013 | Granger-Jones | |
| 8,723,260 B1 * | 5/2014 | Carroll | H01L 21/84 257/347 |
| 8,779,859 B2 | 7/2014 | Su et al. | |
| 9,048,836 B2 | 6/2015 | Maxim et al. | |
| 9,143,124 B2 | 9/2015 | Cam et al. | |
| 9,190,994 B2 * | 11/2015 | Hurwitz | H03K 17/161 |
| 9,214,932 B2 * | 12/2015 | Clausen | H03K 17/063 |
| 9,628,075 B2 * | 4/2017 | Cebi | H03K 17/687 |
| 9,667,244 B1 | 5/2017 | Cavus et al. | |
| 9,712,158 B1 | 7/2017 | Cavus et al. | |
| 9,843,293 B1 | 12/2017 | Wagh et al. | |
| 9,948,281 B2 | 4/2018 | Ranta | |
| 9,960,737 B1 | 5/2018 | Kovac | |
| 9,979,387 B2 | 5/2018 | Wu | |
| 2003/0181167 A1 | 9/2003 | Iida | |
| 2006/0194558 A1 | 8/2006 | Kelly | |
| 2008/0265978 A1 | 10/2008 | Englekirk | |
| 2011/0025404 A1 | 2/2011 | Cassia | |
| 2012/0049956 A1 | 3/2012 | Lam | |
| 2013/0278317 A1 | 10/2013 | Iversen et al. | |
| 2014/0009214 A1 | 1/2014 | Altunkilic et al. | |
| 2014/0253217 A1 | 9/2014 | Briere | |
| 2015/0270806 A1 | 9/2015 | Wagh et al. | |
| 2015/0381171 A1 | 12/2015 | Cebi et al. | |
| 2016/0322385 A1 | 11/2016 | Fuh et al. | |
| 2016/0329891 A1 | 11/2016 | Bakalski et al. | |
| 2017/0201244 A1 | 7/2017 | Kerr | |
| 2017/0201248 A1 | 7/2017 | Scott et al. | |
| 2017/0272066 A1 | 9/2017 | Scott et al. | |
| 2018/0145678 A1 | 5/2018 | Maxim et al. | |
| 2018/0167062 A1 * | 6/2018 | Shanjani | H03K 17/04123 |

OTHER PUBLICATIONS

Lu, Jian et al., "Modeling, Design, and Characterization of Multiturn Bondwire Inductors With Ferrite Epoxy Glob Cores for Power Supply System-on-Chip or System-in-Package Applications," IEEE Transactions on Power Electronics, vol. 25, Issue 8, Aug. 2010, pp. 2010-2017.

Notice of Allowance for U.S. Appl. No. 15/294,337, dated Aug. 7, 2018, 10 pages.

Non-Final Office Action for U.S. Appl. No. 15/849,074, dated Jul. 30, 2018, 8 pages.

Non-Final Office Action for U.S. Appl. No. 15/401,903, dated Sep. 6, 2018, 14 pages.

Non-Final Office Action for U.S. Appl. No. 15/401,903, dated Feb. 26, 2019, 14 pages.

Final Office Action for U.S. Appl. No. 15/401,903, dated Jan. 15, 2019, 14 pages.

Notice of Allowance for U.S. Appl. No. 15/849,074, dated Jan. 25, 2019, 7 pages.

Notice of Allowance for U.S. Appl. No. 15/401,903, dated Jun. 4, 2019, 9 pages.

\* cited by examiner

| Design | Vp | G gate | B body | C Cp1e b2 | D | Dio | Coff @ 1G *20fF | Rv @ 1G [kohm] | Rv @ 3G [kohm] | H2@30 dBm 900M | H3@30 dBm 900M | Max Vds [V] | Sw time of-on [us] | Sw time on-off [us] |
|---|---|---|---|---|---|---|---|---|---|---|---|---|---|---|
| Reference, V | -2.5 | - | - | - | - | - | 145 | 53.89 | 53.8 | -95.9 | -101 | 4.4 | 0.847 | 1.33 |
| Reference, Rg=300k | -2.5 | - | - | - | - | - | 145 | 1156 | 1150 | -112 | -100 | 3.4 | 22.3 | 46.3 |
| Reference, Rg=300k No gb diode | -2.5 | - | - | - | - | - | 144.6 | 1165 | 1159 | -112 | -100 | 2.0 | 31.8 | 46.8 |
| New | -1.9 | + | + | + | + | + | 167 | 947 | 478 | -108 | -129 | 5 | 1.37 | 13.3 |
|  | -2 | - | + | + | + | + | 172.1 | 1046 | 675 | -111 | -106 | 5 |  |  |
|  | -1.9 | + | - | - | - | + | 177.5 | 826 | 556 | -112 | -104 | 5 |  |  |
| Only gate varactor (2/2) | -1.9 | + | - | - | - | - | 170.8 | 1112 | 876 | -99 | -132 | 3.2 |  |  |
| Only has body boost | -2.5 | - | + | + | + | - | 168.9 | 897 | 801 | -111 | -99.5 | 5 |  |  |
|  | -2 | - | + | - | + | + | 168.5 | 1182 | 1006 | -108 | -104 | 3.2 |  |  |
| Only body varactor | -1.9 | - | - | - | + | - | 170.1 | 1096 | 692 | -110 | -103 |  |  |  |
| Arraff, Vg=-2.5 | -2.5 | - | - | - | - | - | 153.1 | 1243 | 1228 | -110 | -98 | 3.2 | 1.46 | 12.3 |

FIG. 13

RF BRANCH WITH ACCELERATED TURN-ON AND HIGH Q VALUE

RELATED APPLICATIONS

This application claims the benefit of U.S. Provisional Application No. 62/276,421, filed Jan. 8, 2016, U.S. Provisional Application No. 62/362,818, filed Jul. 15, 2016, and U.S. Provisional Application No. 62/363,536, filed Jul. 18, 2016, the disclosures of which are hereby incorporated herein by reference in their entireties.

This application is related to commonly owned and assigned U.S. patent application Ser. No. 15/401,903, filed Jan. 9, 2017, entitled "RF BRANCH WITH IMPROVED POWER HANDLING," the disclosure of which is hereby incorporated herein by reference in its entirety.

FIELD OF THE DISCLOSURE

The present disclosure relates to Radio Frequency (RF) switches.

BACKGROUND

Radio Frequency (RF) switches that need to withstand large voltages in the off state use stacked Field-Effect Transistor (FET) configurations. Proper operation requires that each FET has direct current bias on its terminals. A typical RF switch may use a stack of n-type FETs (NFETs) and a bias network to control the state of the transistors, e.g., on or off. Various bias resistor configurations exist. A typical bias network is a parallel or series set of resistors for the gates, bodies, and sources/drains of each transistor.

FIGS. 1A, 1B, and 1C show variations of a conventional approach, in which resistor ladders are used for the gate bias network ($R_{G1}$, $R_{G2}$, . . . ), the drain and source bias network ($R_{SD1}$, $R_{SD2}$, . . . ), and the bulk bias network ($R_{B1}$, $R_{B2}$, . . . ). When the switch is off, the gates are biased at ground level or at a negative potential. To turn the device on, the gate-source voltages of the stacked FETs need to go above the positive threshold voltage (Vth). The bias networks may use resistors configured in series, in parallel, in a tree topology, some other topology, or any combination of the above. For example, FIG. 1A shows a shunt branch with series bias architecture, FIG. 1B shows a branch with parallel bias architecture, and FIG. 1C shows a branch with series bias architecture. Other architectures are contemplated.

Table 1, below, lists some typical bias values (in Volts). In the on state, the source, drain, and body bias voltages are set to 0 Volts and the gate is biased to 2.5 Volts. In the off state, the source and drain are biased to 0 Volts but the body and gate are both set to −2.5 Volts, e.g., strongly off. (The body is sometimes referred to as "the bulk.")

TABLE 1

| State | Vsource | Vdrain | Vbody | Vgate |
| --- | --- | --- | --- | --- |
| on | 0 | 0 | 0 | 2.5 |
| off | 0 | 0 | −2.5 | −2.5 |

FIG. 1D shows the serial resistance configuration of FIG. 1A, additionally showing the parasitic capacitances at each gate ($C_{G1}$, $C_{G2}$, . . . ) and at each source or drain ($C_{SD1}$, $C_{SD2}$, . . . ).

Several different parameters should be considered when designing a bias network:

Responsiveness.

The speed of turn-on is limited by the Resistor-Capacitor (RC) time constant set by the gate (front) and drain/source (back) resistors and their corresponding capacitances ($C_{G\#}$ and $C_{SD\#}$). For example, referring to FIG. 1D, the first FET in the stack, $F_1$, sees mainly its bias resistors $R_{G1}$ and $R_{SD1}$ and parasitic capacitances $C_{G1}$ and $C_{SD1}$. The later FETs in the stack $F_2$, $F_3$, and $F_4$ see a distributed RC network with complex Elmore delay times. Therefore, the turning on of the FETs in the switch stack is progressive one-after-the-other and can take a long time in case of large bias resistors and/or large capacitances. In general, it is desirable to reduce the loading resulting from the bias resistor networks, which requires a minimization of the number of resistor branches going to external bias lines (ground, positive, or negative). The specifications of the new Fourth Generation (4G) and Fifth Generation (5G) cellular applications, the Wireless Fidelity (WiFi) specification, and many other applications limit the maximum turn-on and turn-off times. Thus, it is desired to keep the resistance of the bias resistors low so that the switch turn-on time is minimized.

Power Handling.

The resistor network must carry the direct current (DC). In the off state, as the RF voltage differential between the drain and source ($V_{DS}$) increases, the drain-body and source-body junctions begin to generate current. If the bias network uses very high value resistors, then a DC voltage drop occurs across the bias network, and thus the applied DC voltage is reduced before it reaches the transistor. This causes the power handling to drop. Note that current can flow in the network attached to the body as well as to the source and drain. Thus, it is desired to keep the resistance of the bias resistors low to improve power handling.

Quality Factor.

The Quality Factor (Q) of the switch in off state is set by its bias resistor values. A voltage across a resistor causes power dissipation in the resistor. If the RF voltage induces this power dissipation, then the quality factor is reduced. Therefore, very high value resistors must be used in the bias network to ensure a high quality factor. Typical applications with large and very large bias resistor values are high-Q switched capacitor arrays, for example, Programmable Capacitance Arrays (PACs) or Capacitive Digital-to-Analog Converters (C-DACs). Thus, it is desired to keep the resistance of the bias resistors high to maintain a high Q for the switch.

Thus, there is an intrinsic design trade off to be made: bias resistor values should be kept low to improve responsiveness and power handling but should be kept high to improve quality factor in the off state. What is needed, therefore, is a switch design that provides fast response times and acceptable power handling while providing a high quality factor in the off state.

SUMMARY

Achieving a high Quality Factor (Q) switching network requires large-value bias resistors. A high Q results in lower insertion loss. However, the large resistor values in conjunction with the equivalent loading capacitances leads to long switching (on and off) times. Both the front gate bias resistors and the back drain/source bias resistors contribute to the long time constant. In related-art structures the stacked Field-Effect Transistors (FETs) turn on one after the other separated by relatively long delays given by large Resistor-Capacitor (RC) time constants.

The present disclosure relates to a method and apparatus to achieve fast turning on of the stacked FETs using auxiliary shorting switches that use local bias networks. Both P-type FETs (PFETs) and N-type FETs (NFETs) may be used, depending on the polarity of the control signal and the specific points where the local acceleration network is connected. In one embodiment, PFET switches are locally shorting the gate bias resistors. One advantage of these structures is the fact that they do not need additional bias resistor networks going to ground or another bias voltage, but can instead be controlled using signals taken from existing nodes in the switch stage circuit. In another embodiment, NFET switches are shorting the drain-source resistors.

In one embodiment, the controls for drain-source resistor shorting switches may be anticipative with respect to the gate of each stacked FET. Such control signals can be generated with a separate branch, split from the main gate bias resistor ladder, the separate branch having smaller time constants. The bulk-drain and bulk-source local switches can also be used as acceleration switches if anticipated gate control signals are available. In general, the bulk switching network and the acceleration switching networks can share one or multiple switch devices.

In addition, a design variation is presented herein that improves power handling of the switch in the off state. In one embodiment, an additional circuit improves performance further during high-$V_{DS}$ conditions by reducing the amount of body current that flows through the bias network resistors. When $V_{DS}$ is high, a rectifier or charge pump circuit takes advantage of that condition to create a locally-generated body bias.

According to one aspect, a high Q Radio Frequency (RF) switch comprises one or more stages. Each stage comprises a signal input terminal, a signal output terminal, and a control input terminal. Each stage further comprises a switching device having a first terminal connected to the signal input terminal, a second terminal connected to the signal output terminal, and a third terminal for controlling the on/off state of the switching device. Each stage further comprises a first resistor connected in series between the control input terminal and the third terminal, a first bypass switch for connecting each end of the first resistor to bypass the first resistor when the first bypass switch is closed, and a second resistor connected in series between the signal input terminal and the signal output terminal. The one or more first resistors form a first bias network, the one or more second bias resistors form a second bias network, and the plurality of FETs are connected in series.

In one embodiment, for at least one stage, the first bypass switch operates to bypass the first resistor when the switching device is in the on state and does not operate to bypass the first resistor when the switching device is in the off state.

In one embodiment, for at least one stage, the first bypass switch comprises a plurality of switching devices in series.

In one embodiment, at least one stage further comprises a second bypass switch for connecting each end of the second resistor to bypass the second resistor when the second bypass switch is closed.

In one embodiment, the second bypass switch operates to bypass the second resistor when the switching device is in the on state and does not operate to bypass the second resistor when the switching device is in the off state.

In one embodiment, the control signal for the second bypass switch is derived from the control signal of the first bypass switch.

In one embodiment, the control signal for the second bypass switch is independent from the control signal of the first bypass switch.

In one embodiment, at least one stage further comprises at least one diode connected in series between the second terminal and the control input terminal to provide a discharge path from the second terminal to the control terminal.

In one embodiment, the second terminal is connected to an anode of one of the at least one diode and the control input terminal is connected to a cathode of one of the at least one diode.

In one embodiment, for at least one stage, the switching device comprises a FET, the first terminal comprising a source terminal of the FET, the second terminal comprising a drain terminal of the FET, the third terminal comprising a gate terminal of the FET.

In one embodiment, the FET further comprises a body terminal connected to the body of the FET.

In one embodiment, at least one stage further comprises a first body switch for connecting the source terminal of the FET to the body terminal of the FET when closed and a second body switch for connecting the drain terminal of the FET to the body terminal of the FET when closed.

In one embodiment, the first body switch comprises one or more switching devices in series.

In one embodiment, the second body switch comprises one or more switching devices in series.

In one embodiment, at least one stage further comprises a third body switch for connecting the gate terminal of the FET to the body terminal of the FET when closed.

In one embodiment, the third body switch comprises one or more switching devices in parallel.

In one embodiment, the first body switch or the second body switch also operate as an acceleration network.

In one embodiment, at least one stage further comprises at least one diode connected in series between the source terminal or drain terminal and the body terminal to provide a discharge path from the source terminal or drain terminal to the body terminal.

In one embodiment, the switch comprises multiple stages, wherein the switching devices within the plurality of stages are connected in series.

In one embodiment, the switch provides a pulsed control signal to the third terminal of at least one stage, wherein the pulsed control signal is not active for all of the time that the switching device is on.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure

FIG. 2A shows an exemplary turn-on switching acceleration network according to an embodiment of the subject matter described herein, which uses auxiliary switches to short the gate bias network resistors and the source-drain bias network resistors during turn-on.

FIG. 3A shows an exemplary stage for use in an RF switch branch and having a turn-on switching acceleration network according to an embodiment of the subject matter described herein, which uses auxiliary switches to short the gate bias network resistors during turn-on.

FIG. 3B shows an exemplary stage for use in an RF switch branch and having a turn-on switching acceleration network according to another embodiment of the subject matter described herein, which uses auxiliary switches to short the gate bias network resistors and the source-drain bias network resistors during turn-on.

FIG. 3E shows an exemplary stage for use in an RF switch branch and having a turn-on switching acceleration network according to another embodiment of the subject matter described herein, which uses groups of auxiliary switches to short the gate bias network resistors and the source-drain bias network resistors during turn-on.

FIG. 13 is a table comparing values for reference designs and various embodiments according to the subject matter disclosed herein.

DETAILED DESCRIPTION

At the turning on of a conventional stacked Field-Effect Transistor (FET) switch, the individual switches that are further away in the stack from the external gate control signal turn on later and with a relatively long time constant because of the large bias resistor values needed in high Quality Factor (Q) structures. The present disclosure relates to various acceleration shorting techniques. Specifically, the present disclosure relates to a turn-on switching acceleration network that uses auxiliary switches to short the gate and drain/source bias resistor ladders during the turn-on. An additional technique includes a regulator circuit for boosting body bias levels during high power operating conditions.

Figure 2A:
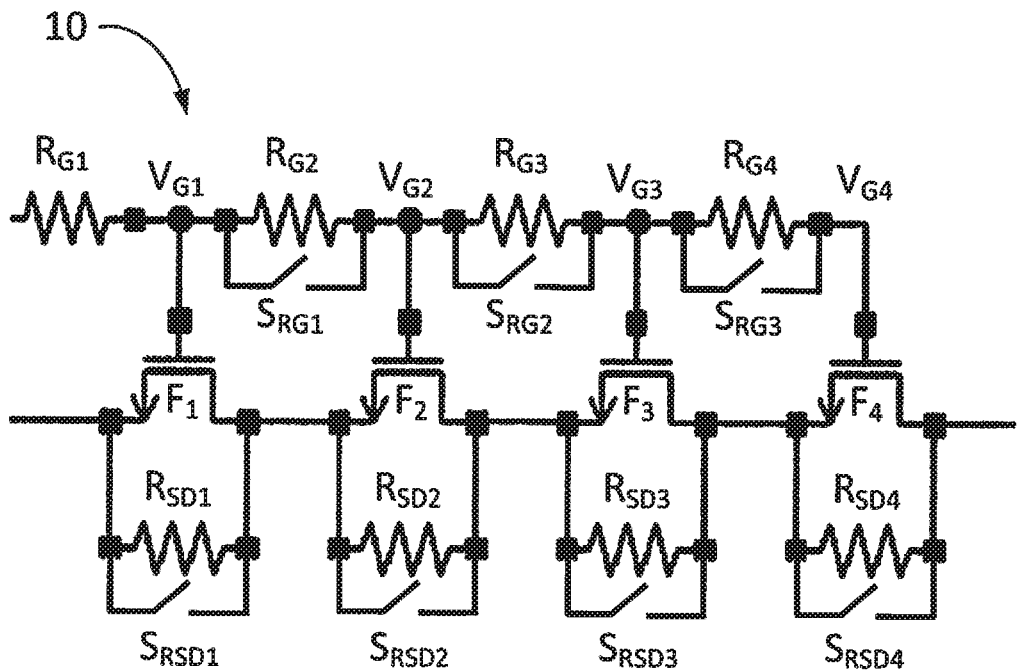

FIG. 2A shows an exemplary turn-on switching acceleration network according to an embodiment of the subject matter described herein, which uses auxiliary switches to short the gate bias network resistors and the source-drain bias network resistors during turn-on. In the embodiment illustrated in FIG. 2A, a Radio Frequency (RF) switch branch 10 includes four FETs, $F_1$ through $F_4$, in series, but switching devices other than FETs may be used, and other numbers of switching devices (e.g., one or more) may be used. A gate bias network includes the bias resistors $R_{G1}$, $R_{G2}$, $R_{G3}$, and $R_{G4}$, one or more of which may be collectively referred to as "$R_{G\#}$." The voltages present at the respective gates of the set of FETs are represented in FIG. 2A as $V_{G1}$, $V_{G2}$, $V_{G3}$, and $V_{G4}$, one or more of which may be collectively referred to as "$V_{G\#}$." A source-drain bias network includes the bias resistors $R_{SD1}$, $R_{SD2}$, $R_{SD3}$, and $R_{SD\#}$, one or more of which may be collectively referred to as "$R_{SD\#}$."

To provide turn-on acceleration, the embodiment illustrated in FIG. 2A includes additional switches $S_{RG1}$, $S_{RG2}$, and $S_{RG3}$ that, when closed, bypass the gate bias network resistors $R_{G2}$, $R_{G3}$, and $R_{G4}$, respectively. Additional switches $S_{RSD1}$, $S_{RSD2}$, $S_{RSD3}$, and $S_{RSD4}$ are included that, when closed, bypass the source-drain bias network resistors $R_{SD1}$, $R_{SD2}$, $R_{SD3}$, and $R_{SD\#}$, respectively. More than one of $S_{RSD}$, $R_G$, $S_{RSD}$, and $R_{SD}$ may be referred to as $S_{RSD\#}$, $R_{G\#}$, $S_{RSD\#}$, and $R_{SD\#}$, respectively. In one embodiment, switches $S_{RG\#}$ may be P-type FETs, or PFETs, and switches $S_{RSD\#}$ may be N-type FETs, or NFETs, but other configurations, including the use of other types of switching devices, is contemplated by the subject matter described herein.

At the end of the turn-on process, the main FETs $F_1$ through $F_4$ are on, shorting the drain/source resistors $R_{SD\#}$, whose role is mainly to provide Direct Current (DC) bias in the off state. To speed up the turn-on process, each element of the gate bias resistor ladder is shorted as soon as the corresponding main switch FET turns on. For example, the voltage $V_{G2}$ changes with the fast time constant set by the resistance of the switch $S_{RG1}$ that shorts the resistor $R_{G2}$ resistor and the switch $S_{RSD1}$ that shorts the resistor $R_{SD1}$.

In one embodiment, switches $S_{RG1}$ and $S_{RSD1}$ need to be turned on as $F_1$ is turning on. In this way the turning on of $F_2$ is accelerated compared with the turning on in traditional configurations. The fractional time constants at the gate front and at the drain/source back are not necessarily the same, depending on the Resistor-Capacitor (RC) values.

The gate bias resistors ($R_{G\#}$) usually see much larger capacitances compared with what the drain/source resistors ($R_{SD\#}$) see. If the drain/source time constants are much smaller compared with the gate time constants, the $S_{RSD\#}$ auxiliary switches may be omitted from the circuit, as shown in FIG. 2B.

Figure 2B:
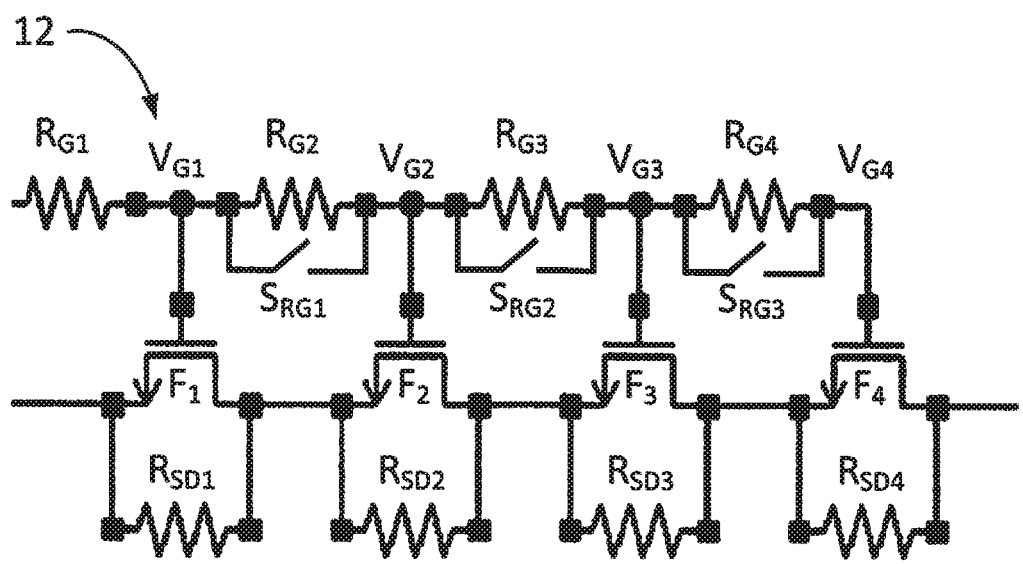
FIG. 2B shows an exemplary turn-on switching acceleration network according to an embodiment of the subject matter described herein, which uses auxiliary switches to short the gate bias network resistors only.

FIG. 2B shows an exemplary turn-on switching acceleration network 12 according to an embodiment of the subject matter described herein, which uses auxiliary switches to short the gate bias network resistors only. This configuration may be used when the RC time constant of the gate bias network is much larger than the RC time constant of the source-drain bias network. In yet another embodiment (not shown), the drain/source resistors ($R_{SD\#}$) may be omitted entirely.

Figure 3A:
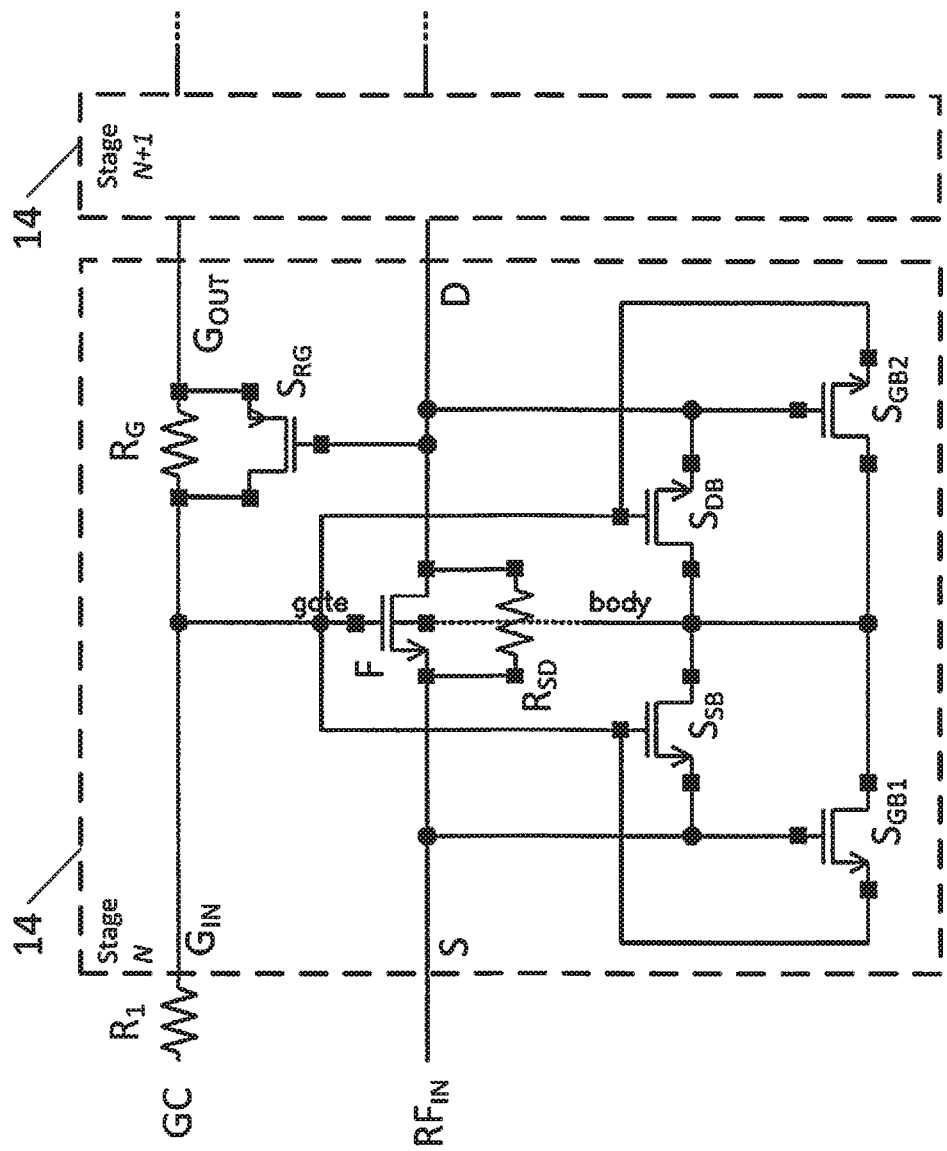

FIG. 3A shows an exemplary stage 14 for use in an RF switch branch and having a turn-on switching acceleration network according to an embodiment of the subject matter described herein, using auxiliary switches to short the gate bias network resistors during turn-on. FIG. 3A illustrates an embodiment of a switching acceleration network used in conjunction with a body switching network. In an exemplary configuration, an RF branch would use one or more instances of the stage 14 connected in series.

Each stage 14 includes a $G_{IN}$ terminal for accepting the gate control signal GC and a $G_{OUT}$ terminal for passing the gate control signal GC to the next stage. For this stage 14 and other stages described below, the last stage in a multi-stage switch need not include the elements downstream from (e.g., to the right of) the gate terminal of F, such as the $G_{OUT}$ terminal, $R_G$, and $S_{RG}$ in the stage 14. Each stage 14 includes a source terminal S and a drain terminal D that connect to the source and drain, respectively, of the main switch device, which in this embodiment comprises a FET F, but other switching devices are also within the scope of the subject matter described herein. The stages may be connected in series to create a multi-stage switch branch by connecting the D terminal of stage N to the S terminal of stage N+1 and by connecting the $G_{OUT}$ terminal of stage N to the $G_{IN}$ terminal of stage N+1. It should be noted that most FETs are symmetric, i.e., the terminals labeled "source" and "drain" could alternatively be labeled "drain" and "source" respectively. In the embodiment illustrated in FIG. 3A, each stage 14 includes a gate bias resistor $R_G$ that, along with resistor $R_1$, is part of a gate bias network and a source-drain bias resistor $R_{SD}$ that is part of source-drain bias network. In one embodiment, the source-drain bias resistor $R_{SD}$ may be omitted.

In the embodiment illustrated in FIG. 3A, an additional switch, $S_{RG}$, is provided that, when on, creates a bypass path around $R_G$, effectively creating a short circuit around $R_G$. By nullifying the resistance $R_G$, the RC constant is reduced dramatically, which reduces the time it takes to charge the gate of the main FET F. This results in an accelerated turn-on of each of the stages as compared to conventional circuits that do not have the bypass switch $S_{RG}$.

FIG. 3A also illustrates a set of switches that create a body bias network. In the embodiment illustrated in FIG. 3A, each stage 14 contains a switch $S_{SB}$, that, when on, connects the source terminal S to the body of the device F. A similar switch $S_{DB}$ connects the drain terminal D to the body of the device F. Switches $S_{GB1}$ and $S_{GB2}$ are provided that, when on, connect the gate terminal to the body of the device F. The operation of this body bias network will now be described.

When the main switch F is off, the switches $S_{GB1}$ (left) and $S_{GB2}$ (right) are shorting symmetrically the bulk (body) to the gate, which in turn is negatively biased to ensure reliable turning off in the presence of large signal swings. The symmetric switching helps improve the even-order harmonic distortion terms. When the main switch F is on, the switches $S_{SB}$ and $S_{DB}$ are shorting the bulk (body) to the source and drain, respectively.

Figure 3B:
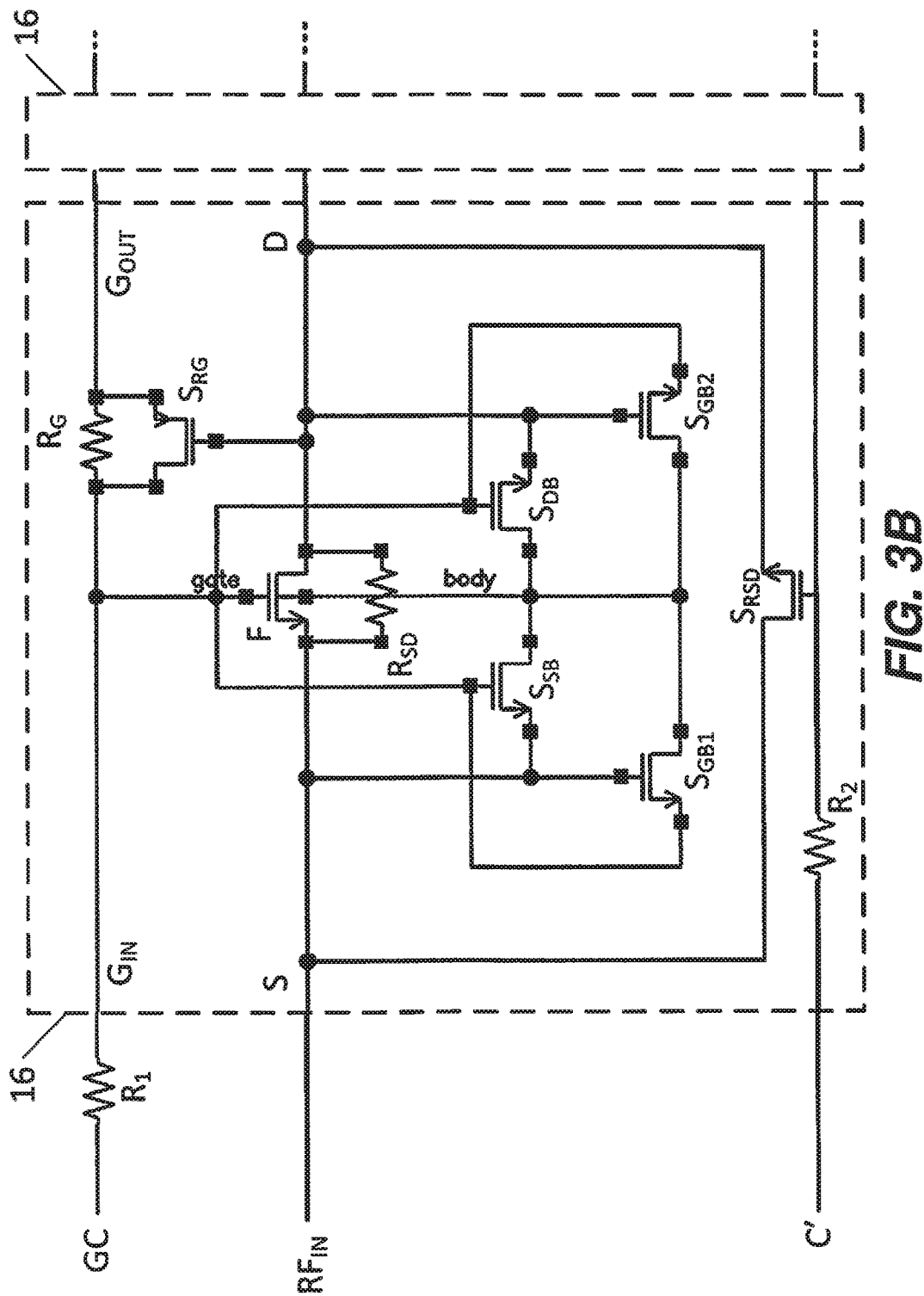

FIG. 3B shows an exemplary stage 16 for use in an RF switch branch and having a turn-on switching acceleration network according to another embodiment of the subject matter described herein, which uses auxiliary switches to short the gate bias network resistors and the source-drain bias network resistors during turn-on. The features $R_G$, $S_{RG}$, F, $R_{SD}$, $S_{SB}$, $S_{DB}$, $S_{GB1}$, and $S_{GB2}$ are identical to the like-named elements in FIG. 3A; therefore, their descriptions will not be repeated here.

In the embodiment illustrated in FIG. 3B, which does include the optional bias resistor $R_{SD}$, an additional switch, $S_{RSD}$, is provided that, when on, connects terminal S to terminal D, which effectively bypasses the bias resistor $R_{SD}$. Thus, in addition to the accelerating the gate control signal GC, the embodiment illustrated in FIG. 3B includes the switch $S_{RSD}$ that reduces the current that might otherwise flow through $R_{SD}$ while the switch is in the on state, which improves the Q factor of the stage and of the multi-stage RF switch as a whole. In the embodiment illustrated in FIG. 3B, $S_{RSD}$ is controlled by a separate control signal, C'. As will be described in more detail below, in different embodiments C' may simply a copy of GC, C' may be derived from GC, or C' may be completely separate from GC.

The drain-source equivalent resistance of FET F becomes very small only after its gate-source voltage is well above the threshold voltage Vth. To speed up the turn-on, the $R_{SD\#}$ resistors should be shorted before the main switch device has fully turned on. Referring to FIG. 3B for example, the $R_{SD}$ resistor needs to be shorted before the FET F has fully turned on. As such, the auxiliary shorting switch $S_{RSD}$ needs to have a gate control that is ahead in time compared with the gate control signal of FET F.

There are several ways in which the drain-source shunting acceleration switch control can be implemented. In one embodiment, a copy of the GC signal is provided to the drain-source acceleration switches $S_{RSD}$ through a network containing resistor $R_2$. In one embodiment, for example, GC and C' are simply connected together, and by selecting a value of $R_2$ that is less than the value of $R_1+R_G$, the copy of the control signal that is sent to $S_{RSD}$ will arrive more quickly, causing $S_{RSD}$ to turn on before $S_{RG}$. An example waveform is shown in FIG. 3C.

Figure 3C:
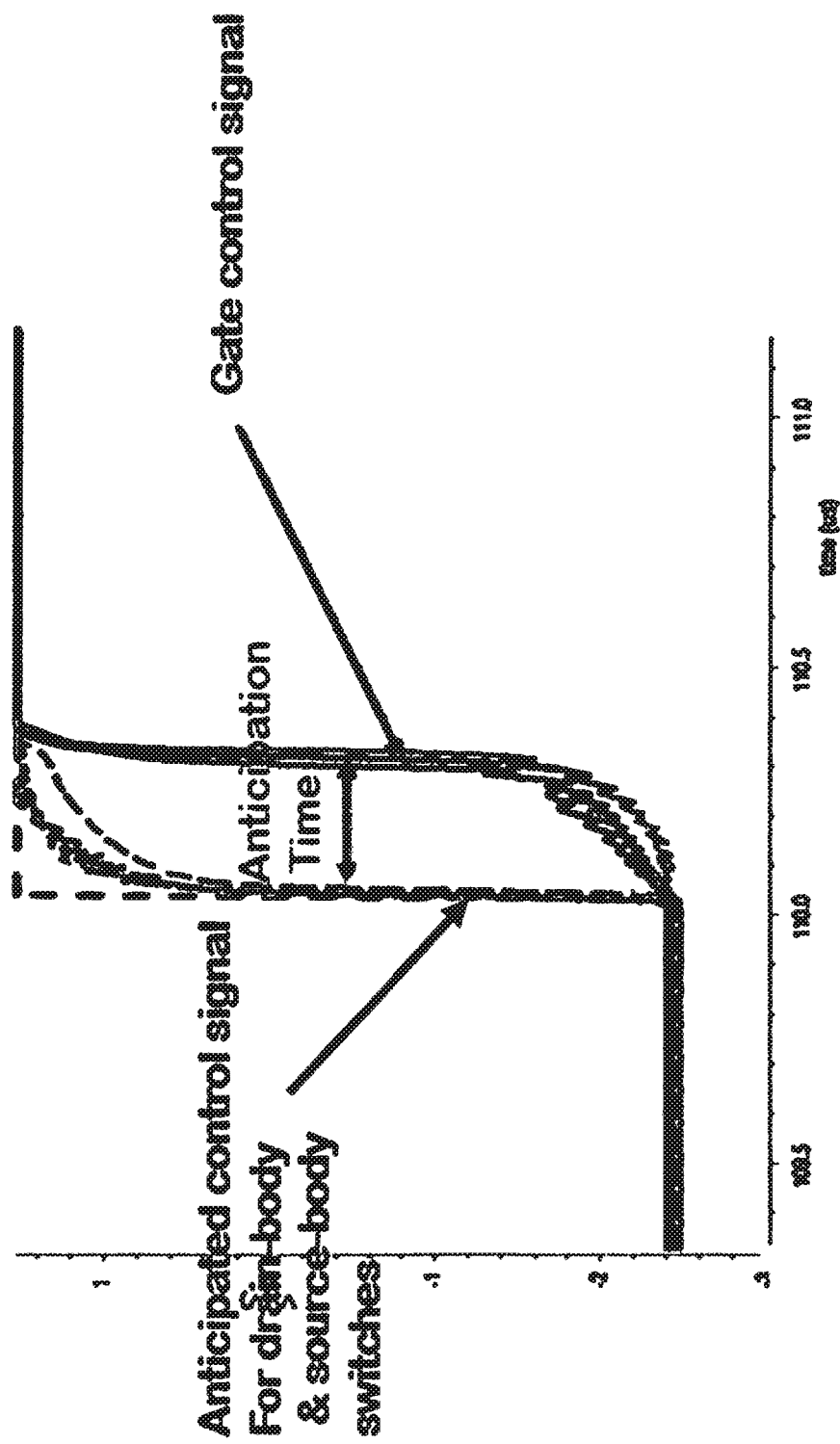
FIG. 3C is a plot of waveforms over time of separate control signals according to an embodiment of the subject matter described herein.

FIG. 3C is a plot of waveforms over time of separate control signals according to an embodiment of the subject matter described herein. In FIG. 3C, one set of control signals, such as signals to control the drain-source acceleration switches $S_{RSD}$, for example, arrive before a second set of control signals, such as the gate control signal. The first set of control signals is said to "anticipate" (i.e., arrive before) the second set of control signals. The delay between the transition of the first set of control signals and the transition of the second set of control signals may be referred to as the "anticipation time." FIG. 3C shows first and second control signals for each of three stages. For each stage, the first control signal for that stage arrives before the second control signal for that stage. Likewise the first control signal for stage N in a signal chain is slightly ahead of the first control signal for stage N+1 in that signal chain, and so on. This configuration allows the accelerations switches to turn on before the main switching devices turn on. Alternatively, C' may be derived from GC, e.g., C' may be a copy of GC that has been passed through a delay circuit.

In an alternative embodiment, a separate control signal, rather than GC, may be used to control the $S_{RSD}$ switches. In one embodiment, this separate control signal C' may have a pulsed waveform or a waveform that is otherwise shaped to optimize the turn-on timing of $S_{RSD}$. An example of this is illustrated in FIG. 3D.

Figure 3D:
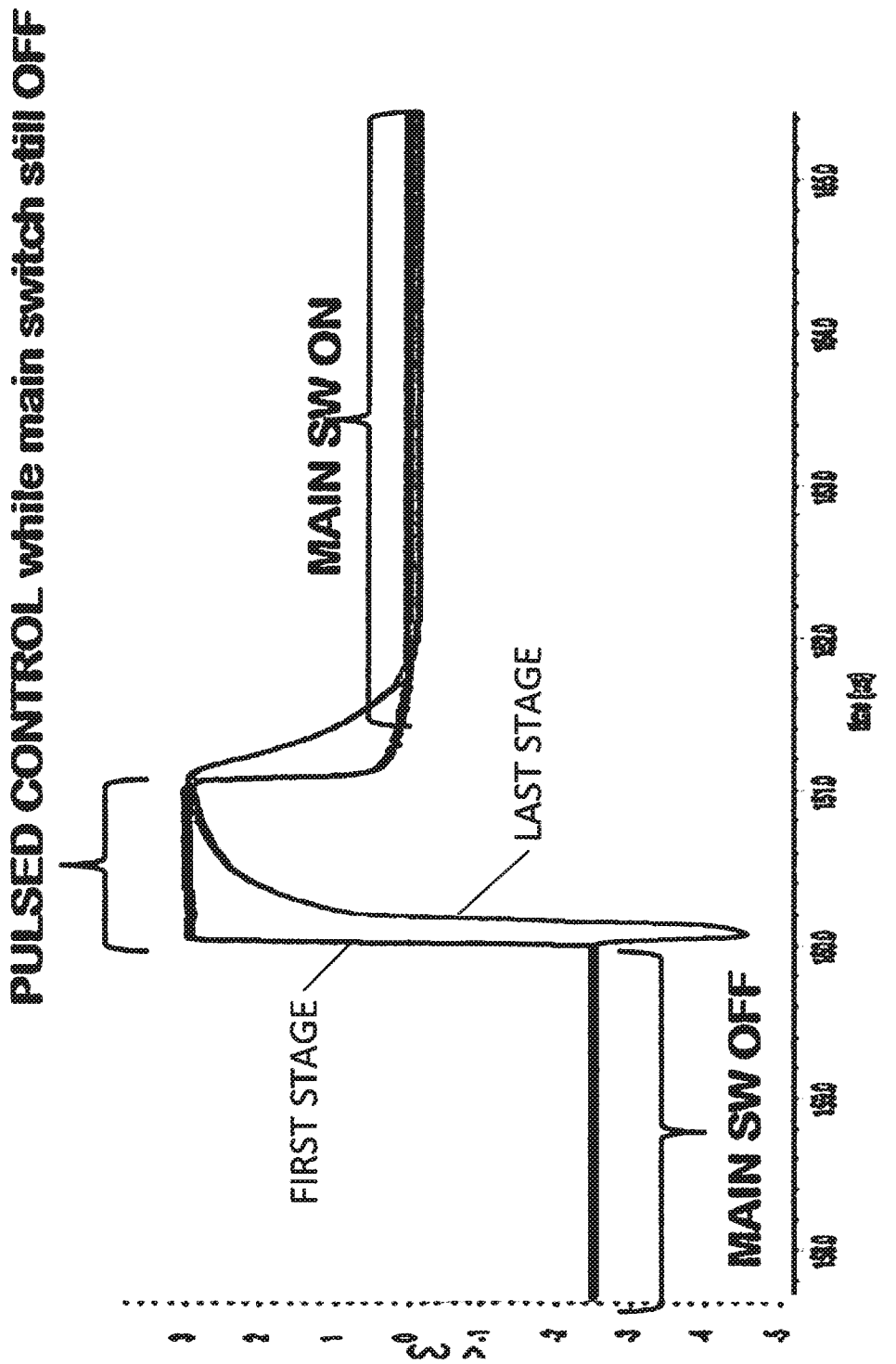
FIG. 3D is a plot of waveforms over time of pulsed control signals that control acceleration switches $S_{RSD}$ (and/or other switches) within each stage according to an embodiment of the subject matter described herein.

FIG. 3D is a plot of waveforms over time of pulsed control signals that control acceleration switches $S_{RSD}$ (and/or other switches) within each stage according to an embodiment of the subject matter described herein. In the example illustrated in FIG. 3D, during turn-on, the acceleration switches $S_{RSD}$ do not need to be on all of the time, but may instead be turned on only at the beginning of the turn-on process, e.g., while the main switches are still off. Once the main switches are on, the acceleration switches need not also be on. FIG. 3D shows the pulsed control signals for the first stage and the last stage of a multi-stage RF switch. The waveforms in FIG. 3D are labeled "first stage" and "last stage," respectively. The pulsed signal of the first stage is closest to the control signal driver and thus has a fast time constant, i.e., the pulse is sharp and relatively square. The pulsed signal that reaches the last stage is farthest from the driver and thus has a slow time constant, i.e., the pulse is more rounded and has a longer rise time and a longer fall time. In the embodiment shown in FIG. 3D, the $V_{GS}$ of the acceleration switch is 2.8 volts when the acceleration switch is on, 0 volts when the acceleration switch is in "soft-off" mode, and −2.8 volts when the accelerations switch is in "hard-off" mode. This provides good distortion tolerance in Power Amplifier Control (PAC) style switches bias circuits where $V_{GBIAS}=V_{RF}$/(number of stages).

In one embodiment, a pulse-shaping or other circuit may produce a pulsed control signal in accordance with this principle, e.g., by activating $S_{RSD}$ only during the first part of the turn-on process. In one embodiment, the time constant of the $S_{RSD}$ control signal network may be shorter than the time constant of other control signals. In one embodiment, the timing of the pulsed control signal may be adjusted relative to the timing of signals that control $S_{RG}$ or other acceleration switches, e.g., to cause the $S_{RSD}$ control signal to lead (or even lag) other control signals. In one embodiment, the signal or signals controlling the acceleration switches may cause those switches to turn on before the local gate signal goes above a threshold voltage level. The same principles may be applied during turn-off, e.g., to by accelerating the turn-off by more quickly discharging intermediary nodes.

In the case of a pulsed control for the drain-source acceleration switches, the $R_{SD\#}$ resistors are needed in order to have a DC bias all the time for the main switch terminals. In some cases, $R_{SD\#}$ resistors may be omitted, provided that DC bias is always provided to the switch terminals. While NFETs are shown in FIG. 3B for the drain-source acceleration switches, alternative embodiments using PFET switches can be derived using appropriate control signals. In alternative embodiments, both NFET and PFET switches can be used. In one embodiment, the switches may be transmission gates, which have parallel connected NFET and PFET switches.

Embodiments having source-drain acceleration switches $S_{RSD}$ but no gate acceleration switches $S_{RG}$ are also within the scope of the present disclosure.

In the example embodiments illustrated FIGS. 3A and 3B, each switch ($S_{RG}$, $S_{SB}$, $S_{DB}$, $S_{GB\#}$, and $S_{RSD}$) is shown as a single FET, but each switch may be implemented using one or multiple FETs. In one embodiment, the auxiliary shorting switches are biased without using supplementary resistor networks. In one embodiment, the gates of the auxiliary shorting switches are biased directly from the main switch network, in which case the choice of type of auxiliary switch is important to facilitate their direct bias from the main switch network. All such choices will be obvious to those skilled in the art, and are considered to be within the scope of the present disclosure.

FIG. 3B illustrates the use of a branched bias resistor ladder that generates the corresponding anticipative gate control signals for the drain-source shorting switches $S_{RSD}$. Other implementations are possible using NFETs, PFETs, or a combination of the two. They are all derived from the same principle of shorting the gate and drain/source bias resistor ladders. Although simple ladder bias resistor networks are provided as an example, other bias resistor networks using series, shunt, or hybrid series-shunt resistor networks are possible. For each of those bias resistor networks exists one or more corresponding auxiliary shorting switch configurations to speed up their turning on. A person skilled in the field can easily derive such networks by following the principles discussed in the present disclosure, and all such configurations are considered to be within the scope of the present disclosure.

Similar anticipative networks may be imagined using series, shunt, or hybrid series-shunt resistor networks. These techniques can be used for both regular switches and switches connected to capacitors at one end or at both ends. They also apply to grounded switches—one side connected to ground, single-ended—or floating switches that have radio frequency signal on both terminals. A differential switch is just a particular case of a floating switch. These variations will be obvious to those skilled in the art and are considered to be within the scope of the present disclosure.

In one embodiment, the auxiliary drain-source resistance shorting switch $S_{RSD}$ may be a separate switch, or it may be made to work in conjunction with the bulk local shorting switches. The bulk-drain ($S_{DB}$) and bulk-source ($S_{SB}$) switches as shown in FIG. 3B are not used to short the drain-source resistance because they are controlled with the same gate signal as the main switch stacked FETs and thus do not provide any acceleration. However, since $S_{DB}$ and $S_{SB}$ are positioned in parallel with $R_{SD}$, these switches could be used in place of $S_{RSD}$ if appropriately-timed control signals were used, e.g., anticipated gate control signals that turn $S_{SB}$ and $S_{DB}$ on before the FET F. Such anticipated control signals may be generated in various fashions, including anticipative parallel branches. Other methods of generation will be obvious to those skilled in the art and are considered to be within the scope of the present disclosure.

Figure 3E:
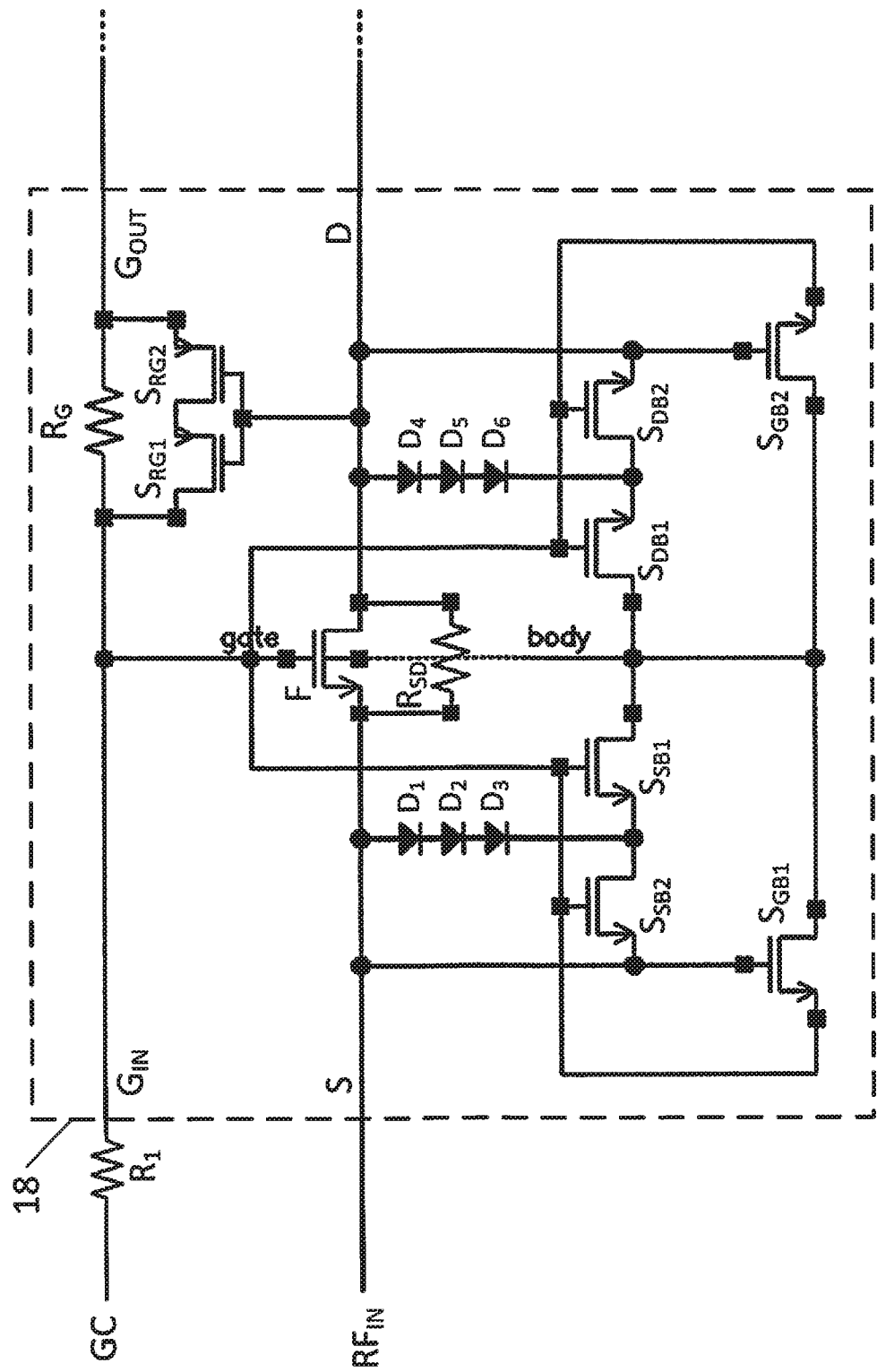

FIG. 3E shows an exemplary stage 18 for use in an RF switch branch and having a turn-on switching acceleration network according to another embodiment of the subject matter described herein, which uses groups of auxiliary switches to short the gate bias network resistors and the source-drain bias network resistors during turn-on. In the embodiment illustrated in FIG. 3E, the stage 18 uses a pair of bypass switches $S_{RG1}$ and $S_{RG2}$ to bypass gate bias network resistor $R_G$, rather than the single switch $S_{RG}$ used in the stage 16 of FIG. 3B. Likewise, the stage 18 of FIG. 3E uses a pair of switches $S_{SB1}$ and $S_{SB2}$ to short the source to the body and a pair of switches $S_{DB1}$ and $S_{DB2}$ to short the drain to the body, rather than a single switch for each. Although the embodiment illustrated in FIG. 3E shows pairs of switches rather than a single switch for each of the above mentioned functions, the subject matter described herein is not limited to just two switches, but contemplates using any number of switches in series, in parallel, or some combination of series and parallel to perform these functions. In the embodiment illustrated in FIG. 3E, a first diode stack $D_1$, $D_2$, and $D_3$, and a second diode stack $D_4$, $D_5$, and $D_6$ provide additional discharge paths.

Figure 4A:
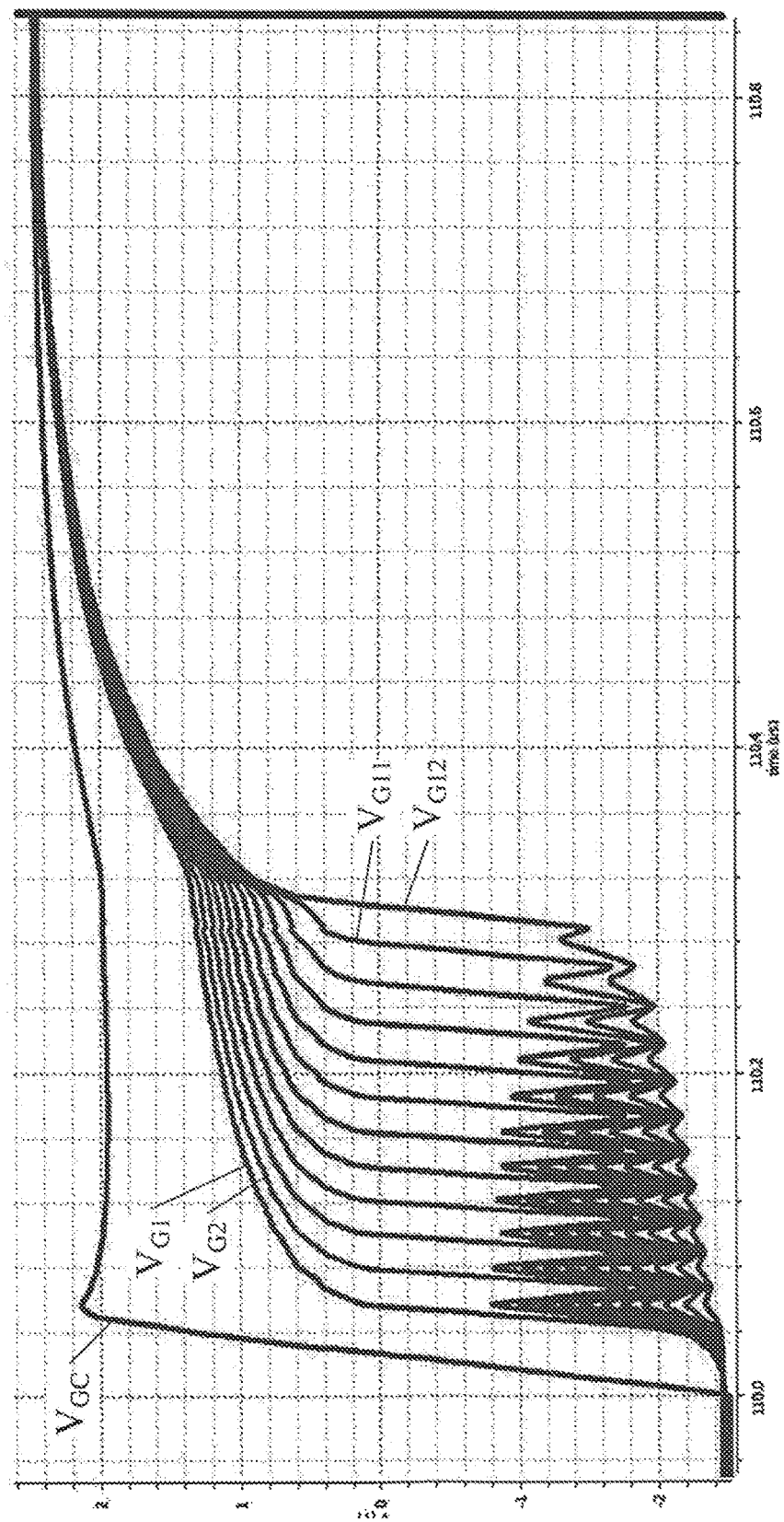
FIG. 4A is a graph showing the gate voltages of an exemplary 12-switch stack according to an embodiment of the subject matter described herein.

FIG. 4A is a graph showing the gate voltages of an exemplary 12-switch stack according to an embodiment of the subject matter described herein. At the turn-on of the main switch FET stack via the gate control signal GC, shown in FIG. 4A as $V_{GC}$, the individual FETs turn on one after the other. FIG. 4A shows the waveforms of the individual gate control signals $V_{G1}$, $V_{G2}$, ... $V_{G11}$, and $V_{G12}$, when acceleration switches $S_{RG}$ are used. In such a case, the turn-on speed of the switch branch is relatively fast once the $S_{RG}$ switches turn on. In a traditional configuration, this speed is much smaller, resulting in long turning on. The global gate control signal GC at the input of the gate bias resistor ladder jumps close to the 2.x V voltage level very fast, limited by its parasitic time constant. The individual gate control signals have growing delay times based on the place they are in the FET stack.

Figure 4B:
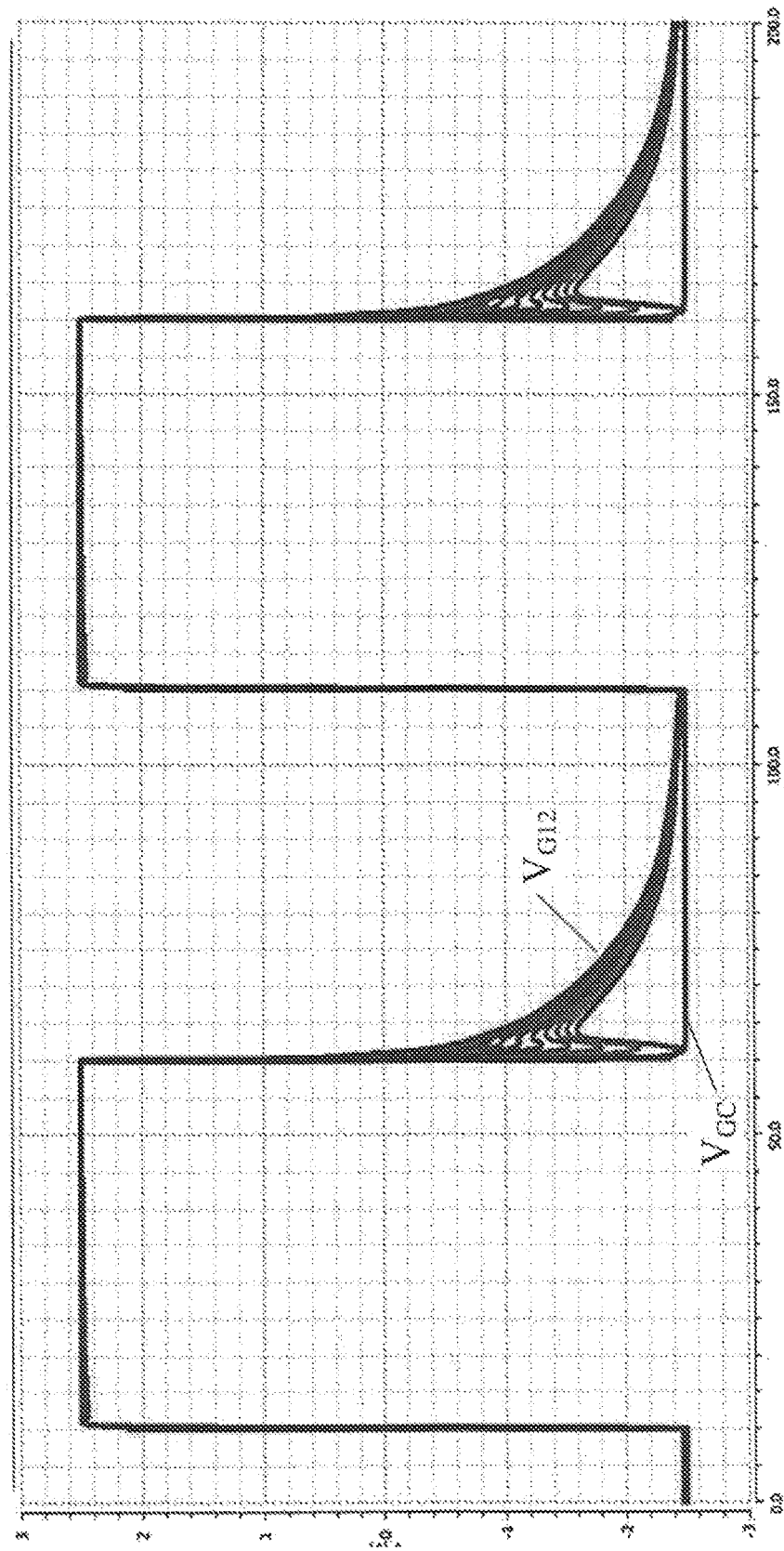
FIG. 4B is a graph showing the turning-on and turning-off waveforms of an exemplary switch according to an embodiment of the subject matter described herein.

FIG. 4B is a graph showing the turning-on and turning-off waveforms of an exemplary switch according to an embodiment of the subject matter described herein. FIG. 4B illustrates the point that the turning-on is much accelerated using the PFET acceleration auxiliary switches of the present disclosure, whereas the turning-off is still relatively slow in comparison to the turn-on time. In FIG. 4B, $V_{GC}$ drops quickly to −2.5 Volts, but $V_{G12}$ takes about 50 µS to reach the same value. Different circuit topology would be needed to speed up the turning-off of the main switch. One example is shown in FIG. 5.

Figure 5:
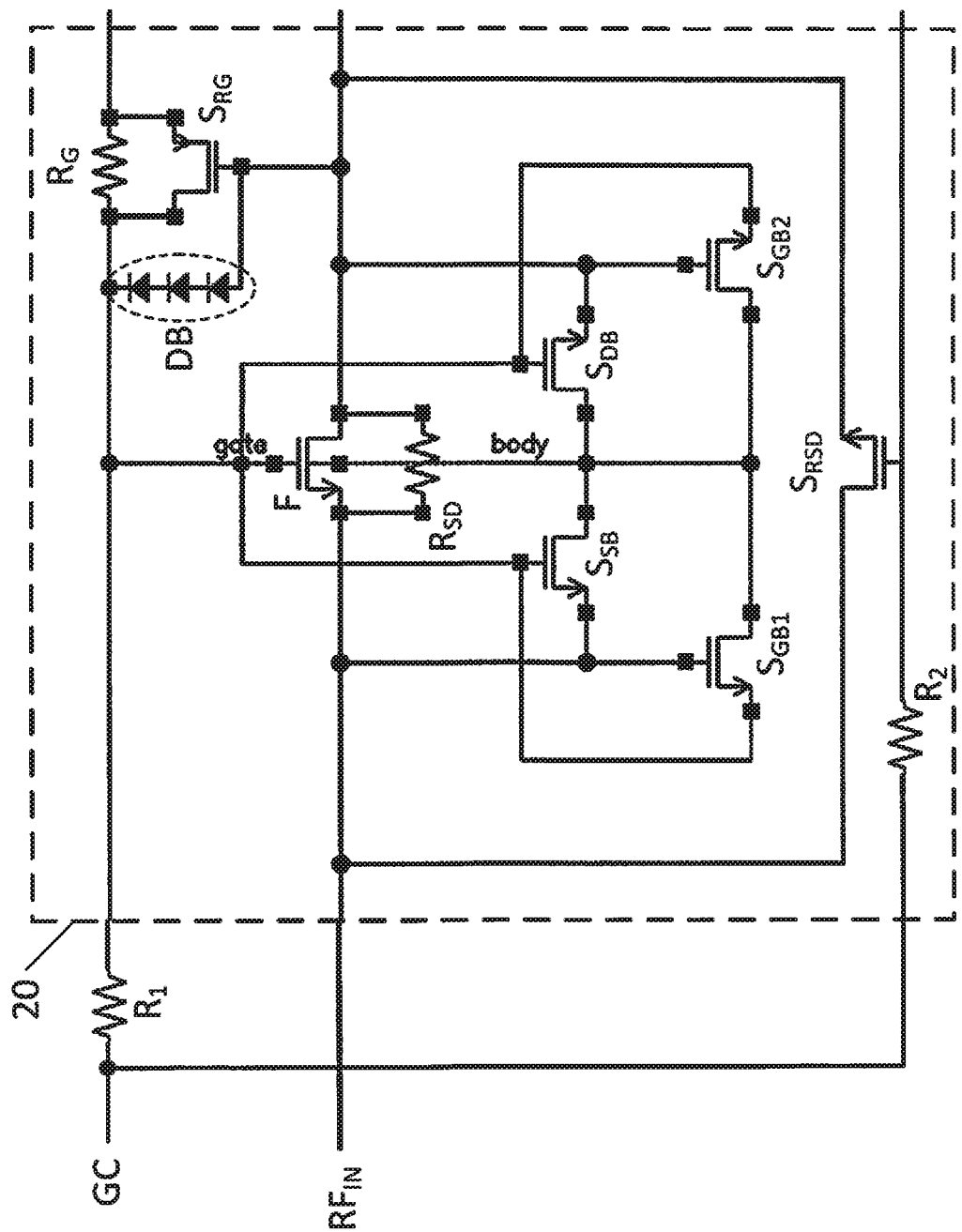
FIG. 5 shows an exemplary stage for use in an RF switch branch and having a turn-on switching acceleration network according to another embodiment of the subject matter described herein.

FIG. 5 shows an exemplary stage 20 for use in an RF switch branch and having a turn-on switching acceleration network according to another embodiment of the subject matter described herein. In the embodiment illustrated in FIG. 5, turn-off is accelerated by providing a low resistivity path to discharge the intermediary nodes between the stacked FETs of the main switch. To achieve this goal, each acceleration PFET $S_{RG}$ has a stacked diode branch DB connected in parallel with its gate, which ensures a path for the discharging current. The diodes are off during most of the operation, except when they need to discharge the local nodes when the PFET acceleration switches are turning off. There are other ways to implement the discharge branches, including various numbers of stacked diodes and also connecting them to different nodes in the structure. The configuration in FIG. 5 is an embodiment that results in low loading of the circuit. Other configurations will be obvious to those skilled in the art and are considered to be within the scope of the present disclosure.

It is desirable to minimize the number of external control signals needed to turn on and turn off the main switch. This is because any additional control signal may require a separate resistor bias network that further loads the main switch and degrades its Q and potentially increase its insertion loss. In the stage 20, for example, switches $S_{RG}$, $S_{SB}$, $S_{DB}$, $S_{GB1}$, and $S_{GB2}$ are controlled by signals from existing internal nodes and do not require additional control signals. However, in some cases, additional control signals are needed, one such example being an anticipative control signal ahead in time from the main control signal, such as the control signal for $S_{RSD}$, or an overdriven control signal with a different amplitude profile. In such cases, a more complex local switching network would be used.

In general, the local bulk switching network and the local acceleration switching network may be merged, and may share one or several switches. This reduces the overall complexity and simplifies the layout implementation. Furthermore, the bias resistor network may also be simplified. For example, a single switch may be used to electrically connect the gate to the body, rather than the pair of switches $S_{GB1}$ and $S_{GB2}$ shown in FIG. 5.

The present disclosure provides for, but is not limited to, the following:

A main switch having one or multiple stacked switching devices and a corresponding bias resistor network for the gates and drain/sources of the stacked devices and a switching acceleration circuit consisting of one or multiple auxiliary switches that are shorting the gate bias resistor ladder elements and/or the drain/source bias resistor elements;

using local PFETs connected with drain and source in parallel with the elements of the gate resistor ladder and the gate biased directly from the main switch stack;

using local NETs connected in parallel with the local drain-source resistors and having an anticipative control signal at the gate that changes state ahead in time of the main switch local gate control signal;

sharing the drain-source resistor shorting switches with the body local switching network, that is bulk-source and bulk-drain sharing switches;

using acceleration diodes to discharge the local nodes in the network when the auxiliary switches are turned off;

using the system for switches with one terminal grounded and for floating switches, including the particular case of differential switches; and using the system for signal switching, capacitor switching, resistor switching, inductor switching, or any other element switching.

The embodiments described above improve the turn-on and turn-off times of an RF switch while maintaining a high Q value. An additional optimization may be used to improve high power handling with no DC bias loss while the switch is in the off state.

Figure 6:
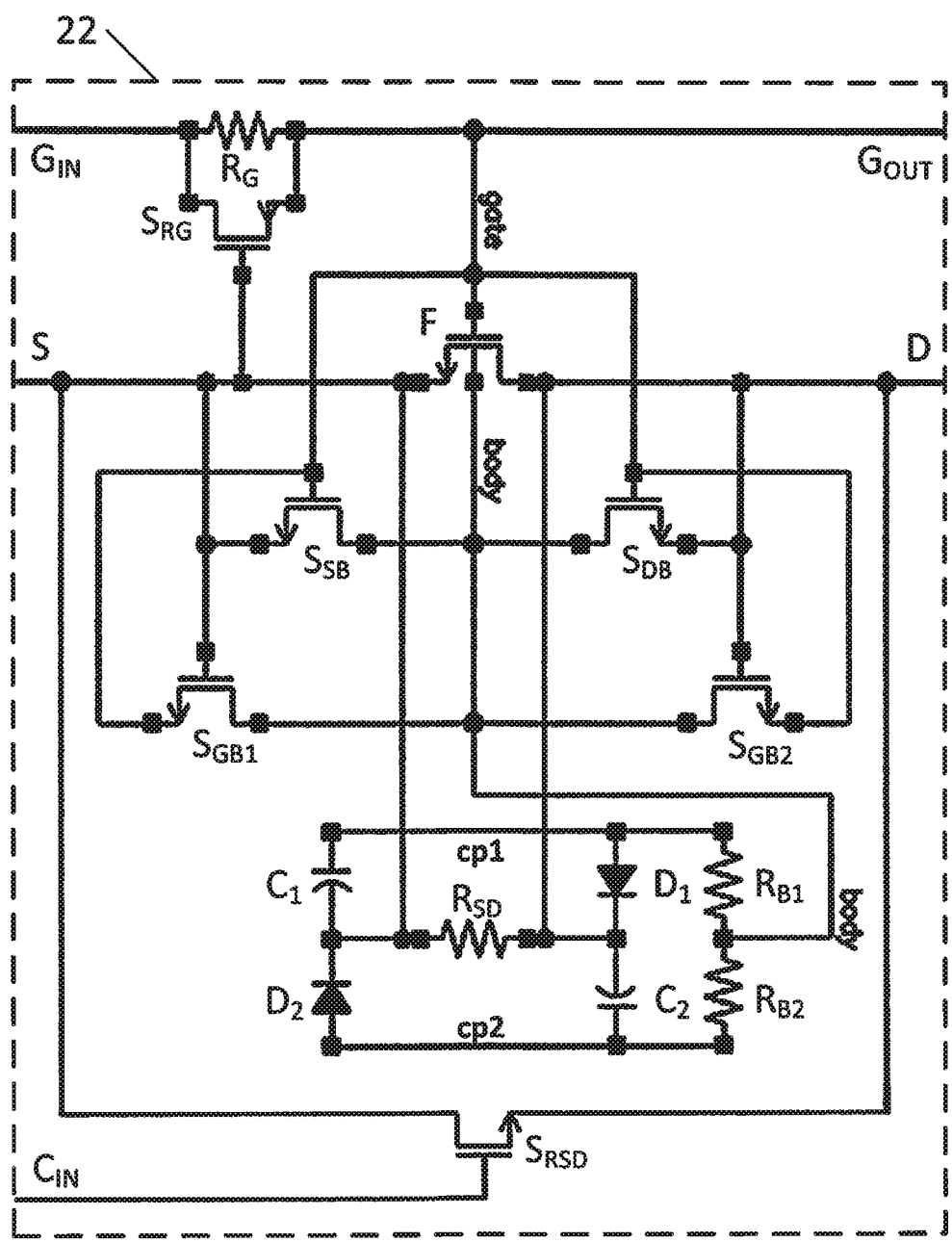
FIG. 6 shows an exemplary stage for use in an RF switch branch and having a circuit for providing local body bias according to an embodiment of the subject matter described herein.

FIG. 6 shows an exemplary stage 22 for use in an RF switch branch and having a circuit for providing local body bias according to an embodiment of the subject matter described herein. In the embodiment illustrated in FIG. 6, the stage 22 includes a main switch, FET F, having a source terminal S and a drain terminal D. The features $G_{IN}$, $G_{OUT}$, $R_G$, $S_{RG}$, $S_{SB}$, $S_{DB}$, $S_{GB1}$, $S_{GB2}$, $R_{SD}$, and $S_{RSD}$ are identical to the like-named elements in FIG. 5; therefore, their descriptions will not be repeated here, except that in the embodiment illustrated in FIG. 6, the source-drain resistor bypass switch $S_{RSD}$ is controlled by a separate control signal $C_{IN}$, which may be derived from $G_{IN}$ or may be completely independent from $G_{IN}$. In one embodiment, the stage 22 may include a $C_{OUT}$ terminal (not shown) for passing the control signal $C_{IN}$ on to the next stage in the series. It is noted that in embodiments that do not include a source-drain resistor $R_{SD}$, switch $S_{RSD}$ may also be omitted.

In the embodiment illustrated in FIG. 6, however, the stage 22 includes additional components capacitors $C_1$ and $C_2$, diodes $D_1$, and $D_2$, and resistors $R_{B1}$ and $R_{B2}$, which, (together with $R_{SD}$, if present) operate to actively bias the body terminal of the FET F, as will be explained in more detail below. The circuit comprising $C_1$, $C_2$, $D_1$, and $D_2$ (and $R_{SD}$, if present) may be referred to herein alternatively as "the rectification circuit," "the charge pump," or "the local body bias circuit."

In summary, the switch $S_{RG}$ operates as a gate resistor short; switches $S_{SB}$ and $S_{DB}$ provide a body-source/drain connection when switch F is in the on state; switches $S_{GB1}$ and $S_{GB2}$ provide a body-gate connection when switch F is in the off state; and the rectification circuit provides a local body bias.

It is noted that there is no conflict between power handling and Q at low RF bias, in which almost no DC current is flowing (i.e., less than nano-amperes). At a moderately high $V_{DS}$, however, a body/drain current begins to appear. In conventional circuits without the rectification circuit shown in FIG. 6, the presence of this body/drain current at high $V_{DS}$ reduces the power handling of the branch.

Figure 7:
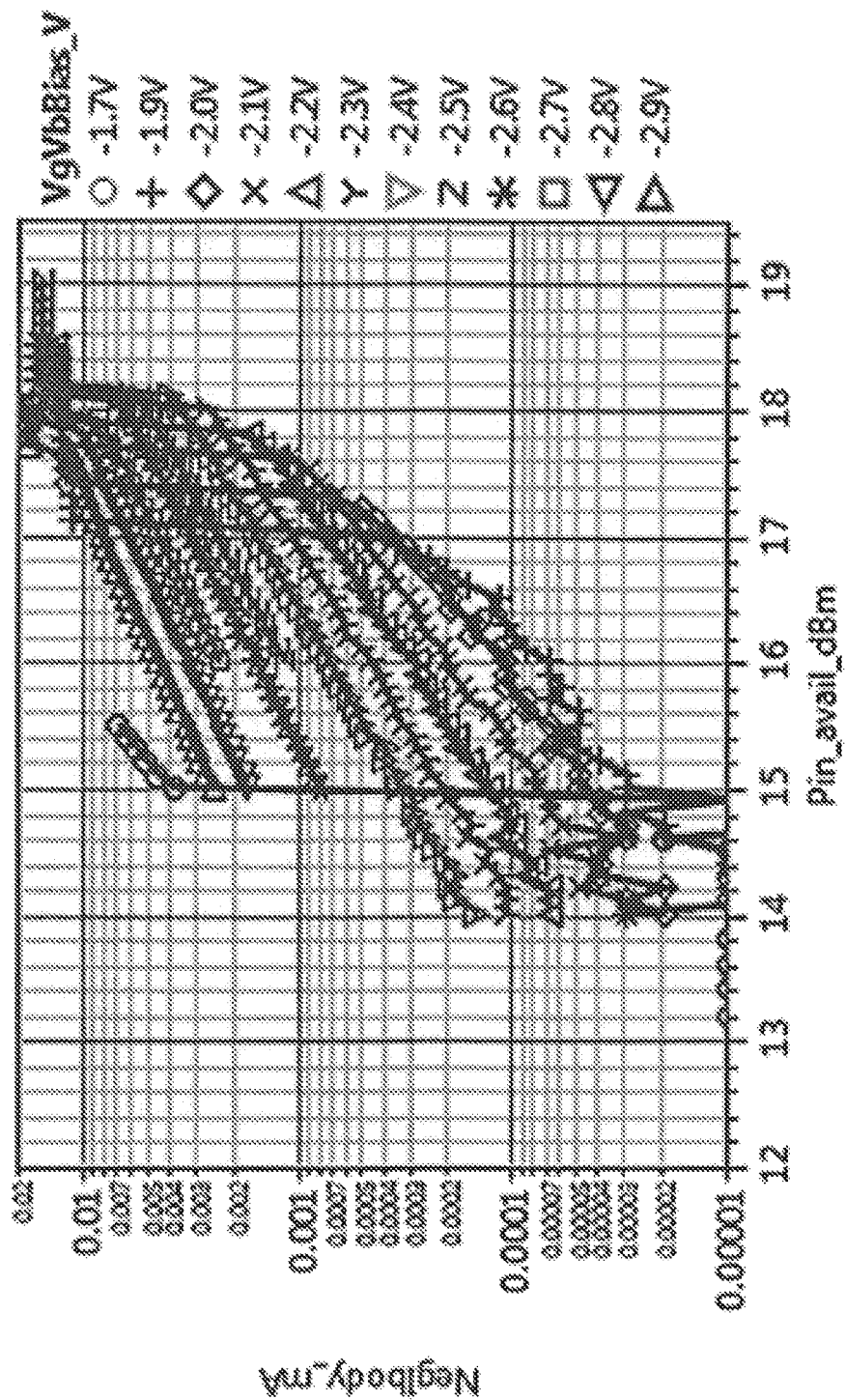
FIG. 7 is a graph showing body current produced in an off state branch when RF power is applied.

FIG. 7 is a plot showing body current produced in an off state branch when RF power is applied. The bias applied to both gate and body is the same and is labeled in the legend "VgVbBias_V" in volts. The branch is a single 4 mm transistor. The voltage across the FET is 3.5 V at an input power ($P_{IN}$) of 15 dBm.

In contrast to conventional circuits, in the embodiment illustrated in FIG. 6, when a high $V_{DS}$ is present, the rectification circuit operates to transfer charge from the source/drain to the body, which completes the circuit started by the drain-body leakage. In this manner, a charge balance is restored locally at each transistor without reference to remote DC supplies. This mitigates or eliminates the effects of a DC current in a high-value resistor such as $R_{SD}$.

Referring back to FIG. 6: in the off state, the voltage across $R_{SD}$ is the same as the voltage $V_{DS}$ across the switch F, and this voltage $V_{DS}$ is responsible for producing source/drain to body current. It is noted that $V_{DS}$ will be present with or without $R_{SD}$. In the off state, the body is at a negative DC voltage, for example, −2.5 V, and the source/drain is at DC 0 V. The rectification circuit uses the $V_{DS}$ to "pump" the body to a more negative value as follows. If $V_{DS}$=3.5 V, for example, capacitor $C_1$ pulses the node cp1 to a more positive voltage by $V_{DS}$, e.g., to +1 V. This causes a pulse of current to flow through diode D1 between body and source/drain, which lowers the DC bias of the body relative to the source/drain. On the other half RF cycle, capacitor $C_2$ and diode $D_2$ perform the same function. The resistors $R_{B1}$ and $R_{B2}$ connect to the body while isolating the cp1 and cp2 nodes from each other. Each of the diodes $D_1$ and $D_2$ may be a PN-junction diode or a diode-connected FET. The PN-junction diode has a turn-on of about 0.8 V, whereas the turn-on of the diode-connected FET depends on its threshold voltage. The reverse bias voltage across $D_1$ or $D_2$ can be fairly high, in the worst case of |VNEG|+$V_{DS}$, so the diode-connected FET may not be appropriate from the standpoint of reliability. In the embodiment illustrated in FIG. 6, the rectification circuit is symmetrical about $R_{SD}$ to avoid second harmonic degradation.

In one embodiment, switch stages 14, 16, 18, 20, and 22 may be stacked to create a switch branch element. Other alternatives are also possible, such as the embodiments with multiple common resistors or different combinations of single stack elements. For example, a stage may have all of the following elements: a gate resistor bypass switch (e.g. $S_{RG}$); source to body or drain to body switches (e.g., $S_{SB}$, $S_{DB}$); gate to body switches (e.g., $S_{GB1}$, $S_{GB2}$); a source-drain resistor bypass switch (e.g., $S_{RSD}$) and a rectification circuit (e.g., $C_1$, $C_2$, $D_1$, $D_2$, $R_{B1}$, and $R_{B2}$), such as the stage 22 shown in FIG. 6.

Not all of these features are required, however. For example, a stage may be similar to the stage 22 in FIG. 6 but without the gate resistor bypass switch $S_{RG}$, without the source/drain to body switches $S_{SB}$ and $S_{DB}$, without the gate to body switches $S_{GB\#}$, and/or without the source drain resistor bypass switch $S_{RSD}$. Other embodiments having different combinations of these elements are also within the scope of the subject matter described herein. One such example is illustrated in FIG. 8.

Figure 1A:
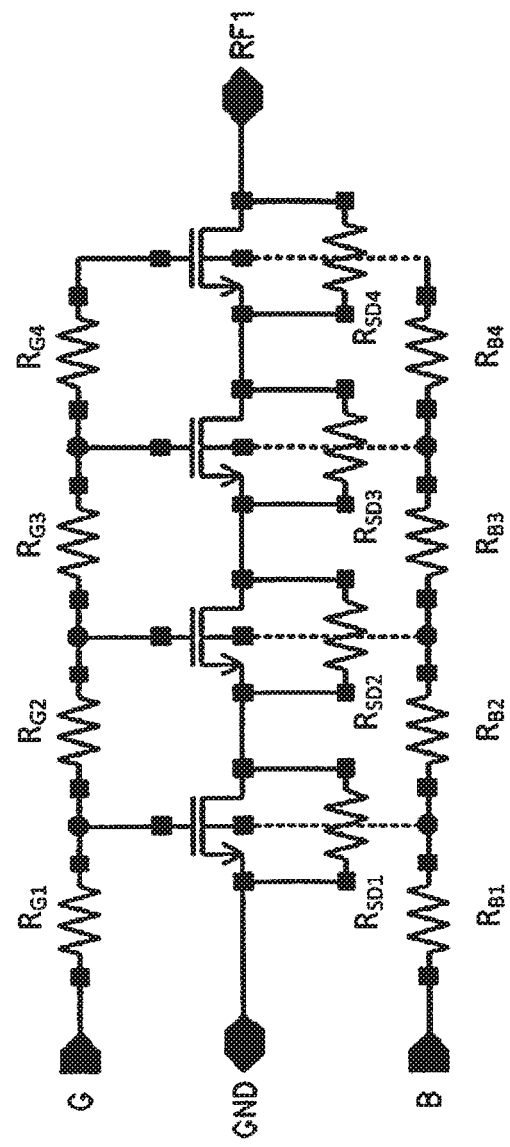
FIG. 1A shows a conventional Radio Frequency (RF) switching branch having a series-connected resistor bias network.
Figure 1B:
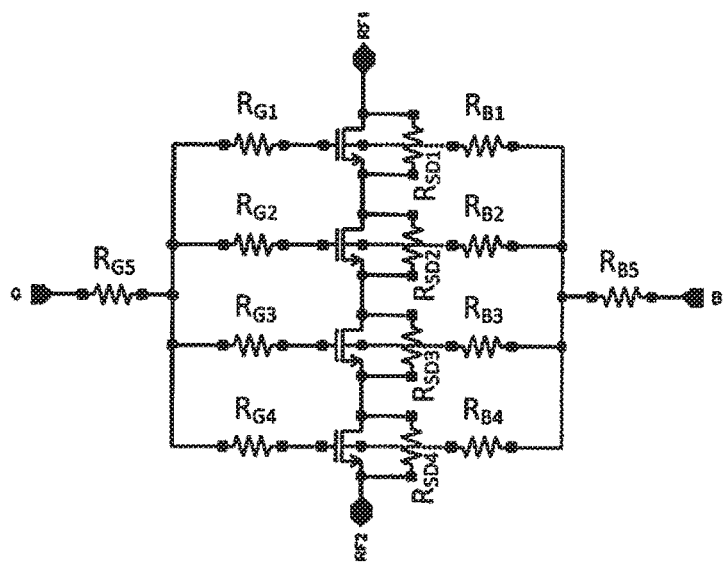
FIG. 1B shows a conventional RF switching branch having a parallel-connected resistor bias network.
Figure 1C:
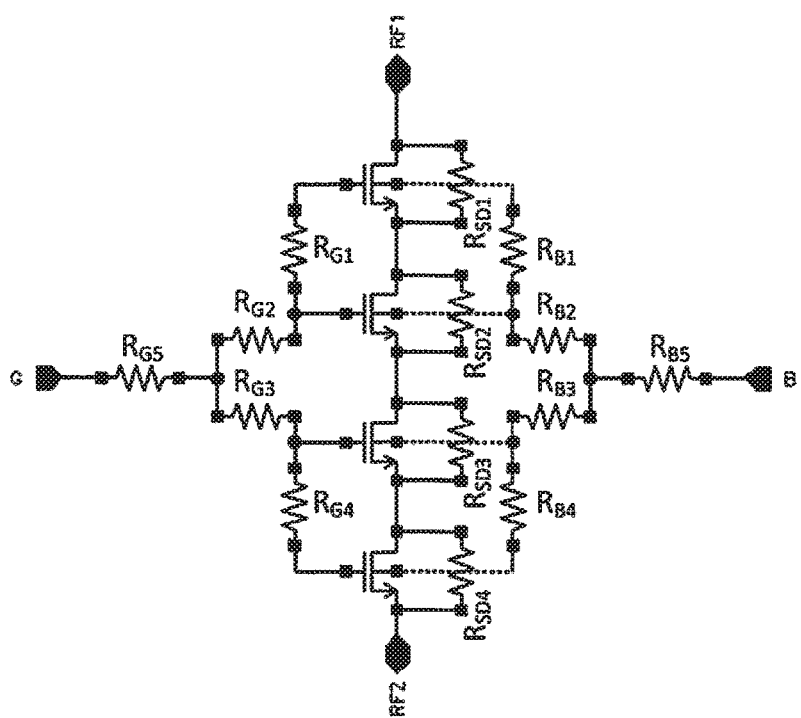
FIG. 1C shows a conventional RF switching branch having a tree-connected resistor bias network.
Figure 1D:
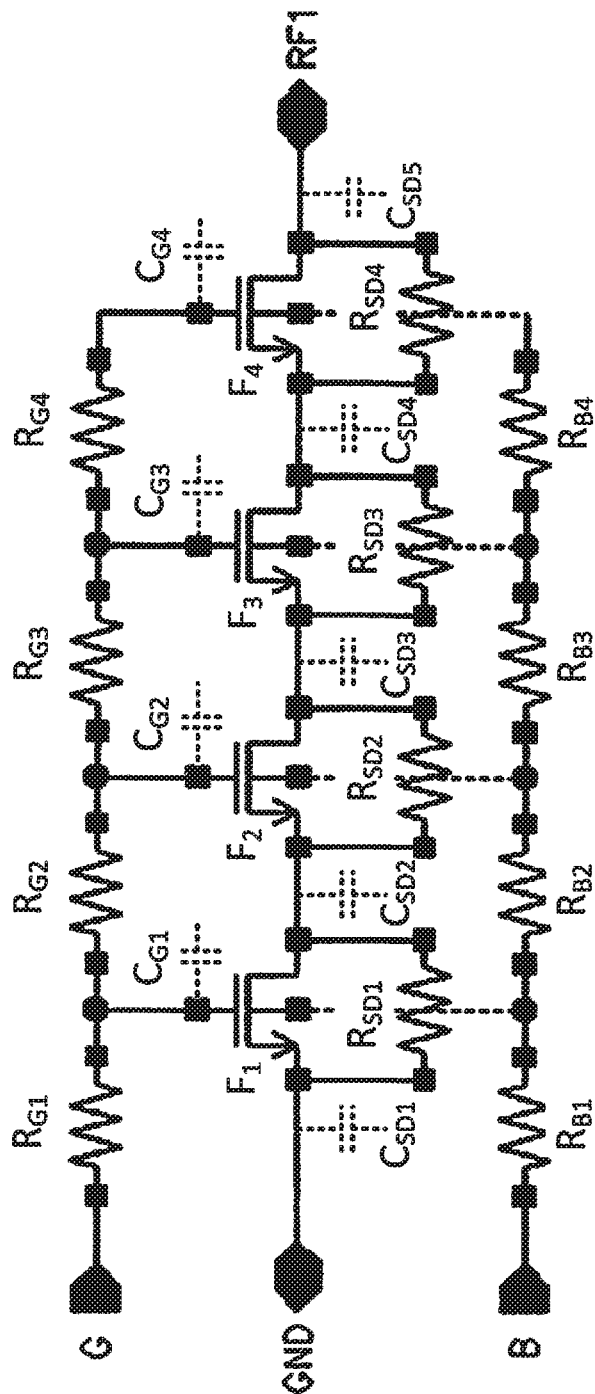
FIG. 1D shows the conventional RF switching branch configuration in FIG. 1A, additionally showing parasitic capacitances.
Figure 8:
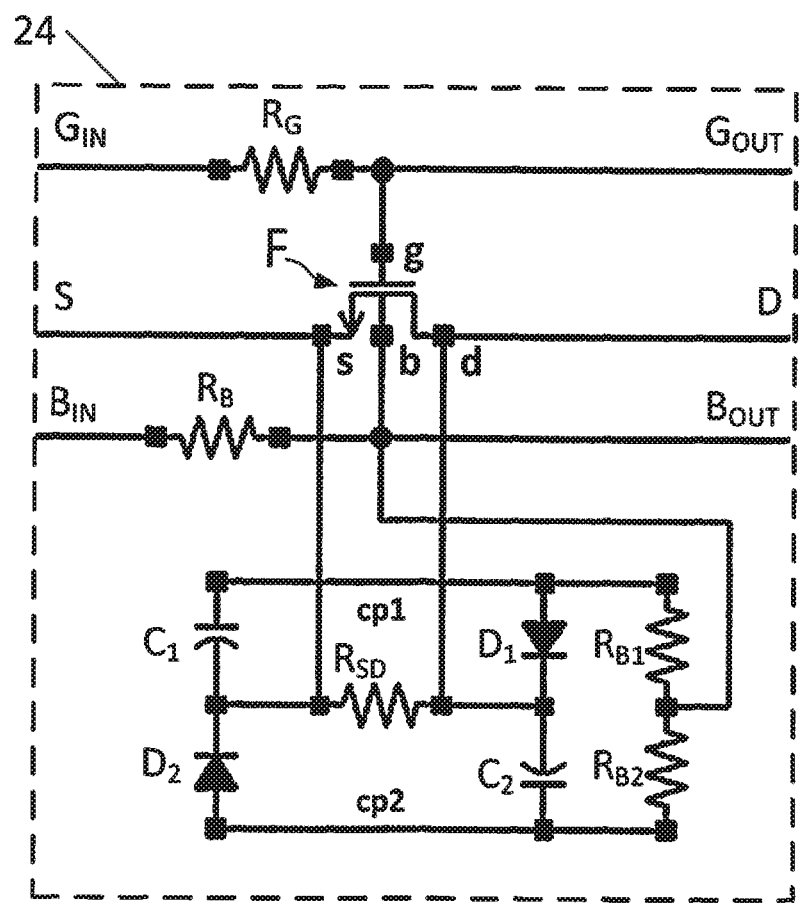
FIG. 8 shows an exemplary stage for use in an RF switch branch and having a circuit for providing local body bias according to another embodiment of the subject matter described herein.

FIG. 8 shows an exemplary stage 24 for use in an RF switch branch and having a circuit for providing local body bias according to another embodiment of the subject matter described herein. FIG. 8 illustrates the point that a stage may use the rectification circuit by itself, e.g., without the additional acceleration switches for bypassing the gate bias resistors $R_G$, the switches for bypassing the source-drain bias resistors $R_{SD}$, and/or the switches for connecting the source, drain, or gate to the body. As mentioned above, in some embodiments $R_{SD}$ may also be omitted. In the embodiment illustrated in FIG. 8, the features $G_{in}$, $R_G$, $G_{OUT}$, F, S, D, $C_1$, $C_2$, $D_1$, $D_2$, $R_{SD}$, $R_{B1}$, $R_{B2}$, cp1, and cp2 are identical to the like-named elements in FIG. 6; therefore, their descriptions will not be repeated here. In the embodiment illustrated in FIG. 8, terminal $B_{IN}$, resistor $R_B$, and terminal $B_{OUT}$ provide a body bias resistor network for the stage 24. In other embodiments, the rectification circuit illustrated in FIG. 8 may be used with some or all of the switches $S_{RG}$, $S_{SB}$, $S_{DB}$, $S_{GB\#}$, and $S_{RSD}$ shown in FIGS. 5 and/or 6. It is noted that the stage 24 may be used to construct switches having the same general topologies as the switches shown in FIGS. 1A, 1B, and 1C. For example, if the $B_{OUT}$ of stage N is connected to the $B_{IN}$ of stage N+1 and the $G_{OUT}$ of stage N is connected to the $G_{IN}$ of stage N+1, the topology of the switch in FIG. 1A is produced. If the $G_{IN}$ terminals of all stages are connected in parallel and the $B_{IN}$ terminals of all stages are connected in parallel while leaving the $B_{OUT}$ and $G_{OUT}$ terminals unconnected, the topology of the switch in FIG. 1B is produced. Likewise, the topology of the switch in FIG. 1C may also be produced by connecting the control signals appropriately.

Figure 9:
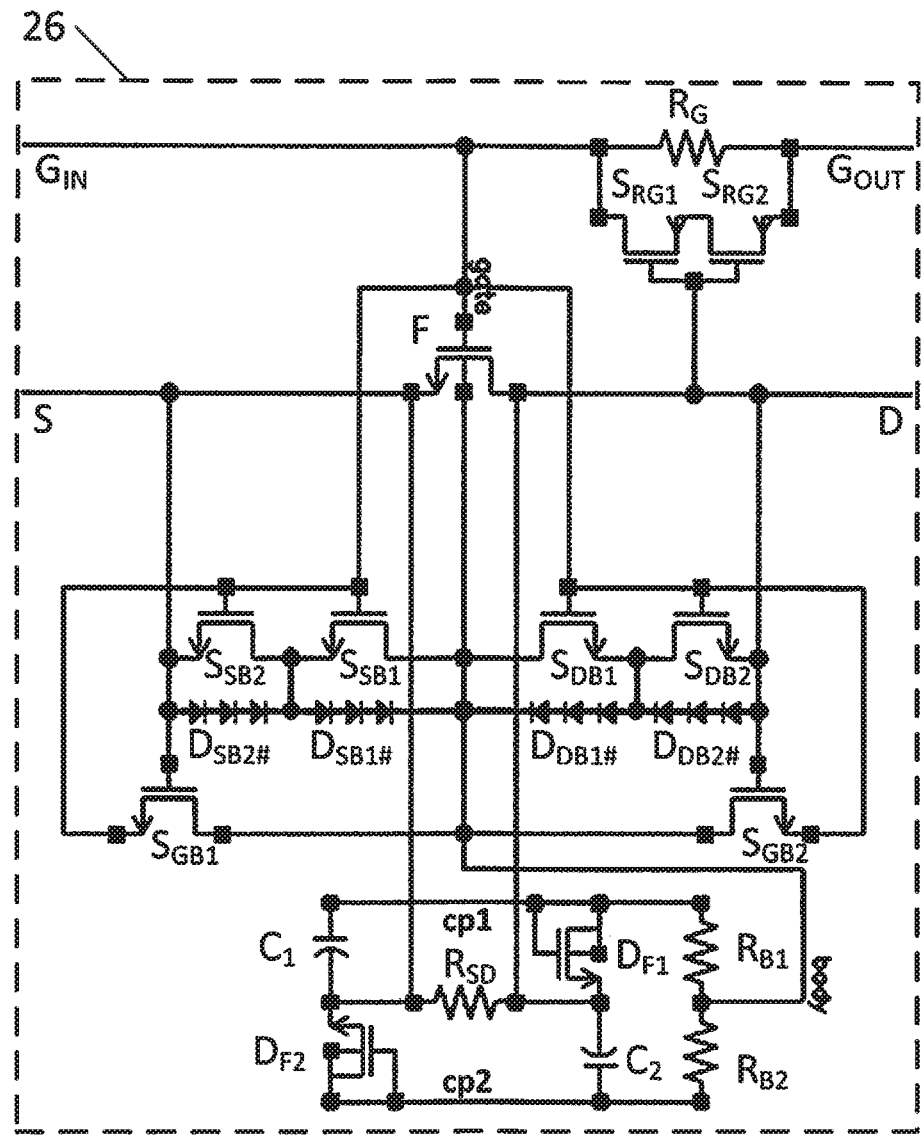
FIG. 9 shows an exemplary stage for use in an RF switch branch and having a circuit for providing local body bias according to another embodiment of the subject matter described herein.

FIG. 9 shows an exemplary stage 26 for use in an RF switch branch and having a circuit for providing local body bias according to another embodiment of the subject matter described herein. In the embodiment illustrated in FIG. 9, the stage 26 includes a main switch, FET F, having a source terminal S and a drain terminal D. The features $G_{IN}$, $G_{OUT}$, $R_G$, $S_{GB1}$, $S_{GB2}$, $R_{SD}$, $C_1$, $C_2$, $R_{B1}$, and $R_{B2}$ are identical to the like-named elements in FIG. 6; therefore, their descriptions will not be repeated here. The stage 26 in FIG. 9 differs from the stage 22 in FIG. 6 in a number of respects. Rather than using a single switch $S_{RG}$, the stage 26 in FIG. 9 uses a pair of switches $S_{RG1}$ and $S_{RG2}$ connected in series. Likewise, the stage 26 in FIG. 9 uses a pair of switches $S_{SB1}$ and $S_{SB2}$ instead of the single switch $S_{SB}$ used by the stage 22 in FIG. 6. The stage 26 in FIG. 9 uses a pair of switches $S_{DB1}$ and $S_{DB2}$ instead of the single switch $S_{DB}$ used by the stage 22 in FIG. 6. The stage 26 in FIG. 9 includes additional diode sets $D_{SB1\#}$, $D_{SB2\#}$, $D_{DB1\#}$, and $D_{DB2\#}$ to provide additional discharge paths to the body. In the embodiment illustrated in FIG. 9, each diode set contains three diodes in series, but other numbers of diodes are considered to be within the scope of the present disclosure. Finally, the stage 26 in FIG. 9 uses diode-connected FETs $D_{F1}$ and $D_{F2}$, rather than the PN junction diodes $D_1$ and $D_2$ used by the stage 22 in FIG. 6. The rectification circuit may use a PN junction diode, a diode-connected NFET, or a diode-connected PFET.

Figure 10:
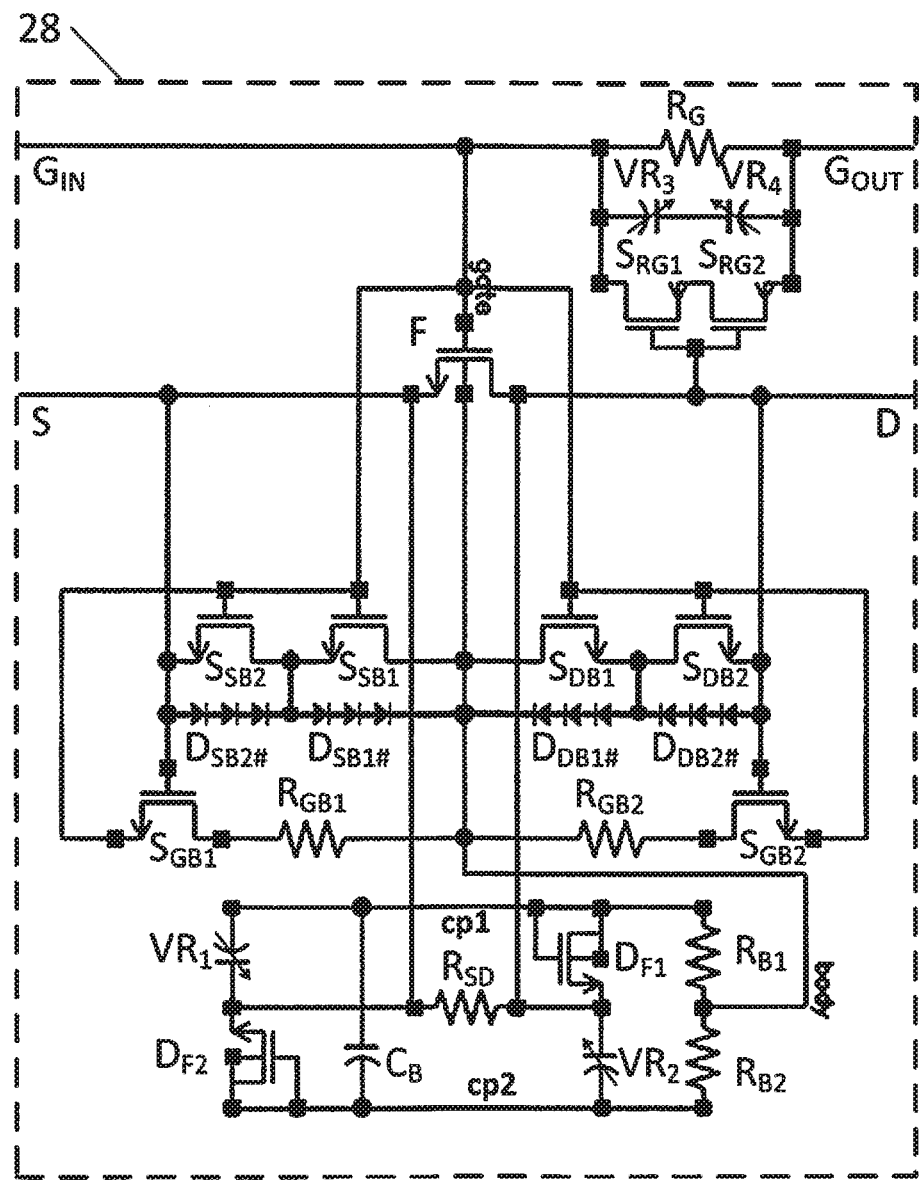
FIG. 10 shows an exemplary stage for use in an RF switch branch and having a circuit for providing body bias according to another embodiment of the subject matter described herein.

FIG. 10 shows an exemplary stage 28 for use in an RF switch branch and having a circuit for providing body bias according to another embodiment of the subject matter described herein. In the embodiment illustrated in FIG. 10, the features $G_{IN}$, $R_G$, $G_{OUT}$, $S_{RG1}$, $S_{RG2}$, F, S, D, $S_{SB1}$, $S_{SB2}$, $S_{DB1}$, $S_{DB2}$, $S_{GB1}$, $S_{GB2}$, $R_{SD}$, $D_{F1}$, $D_{F2}$, $R_{B1}$, $R_{B2}$, cp1, and cp2 are identical to the like-named elements in FIG. 9; therefore, their descriptions will not be repeated here. In the embodiment illustrated in FIG. 10, the stage 28 includes additional resistors $R_{GB1}$ and $R_{GB2}$ in series with switches $S_{GB1}$ and $S_{GB2}$, respectively.

In the embodiment illustrated in FIG. 10, the stage 28 includes Metal Oxide Semiconductor (MOS) varactors $VR_1$ and $VR_2$ are used in place of the capacitor elements $C_1$ and $C_2$ used in the stage 26 in FIG. 9. Along with the diode-connected FETs $D_{F1}$ and $D_{F2}$, varactors $VR_1$ and $VR_2$ serve to boost the body bias when a large voltage is present across terminals S and D. The varactors $VR_1$ and $VR_2$ along with linear capacitor $C_B$ also serve as body linearization. In the embodiment illustrated in FIG. 10, varactors $VR_3$ and $VR_4$ are used with switches $S_{RG1}$ and $S_{RG2}$ for gate linearization. Diode groups $D_{SB1\#}$, $D_{SB2\#}$, $D_{DB1\#}$, and $D_{DB2\#}$ provide additional discharge paths, where each group may comprise one or more diodes. In the embodiment illustrated in FIG. 10, for example, each diode group includes three diodes connected in series, but other configurations are within the scope of the subject matter claimed.

In an alternative embodiment, multiple FETs in series having the same gate bias may be used instead of a single FET. Thus, single switch $S_{RG}$ could be replaced by multiple switches $S_{RG\#}$, single switch $S_{SB}$ could be replaced by multiple switches $S_{SB\#}$, single switch $S_{DB}$ could be replaced by multiple switches $S_{DB\#}$, and so on. Another alternative is to place the rectification circuit across more than one transistor. The capacitor and diode may be connected to each other across more than one transistor in the stack. This allows the rectification to occur at a lower $V_{DS}$ (because the circuit now rectifies n×$V_{DS}$, where n is the number of FETs that separates the varactor and diode). Yet another alternative embodiment also includes off state harmonic linearization. Other alternatives will be obvious to those skilled in the art, and are considered to be within the scope of the present disclosure.

Figure 11A:
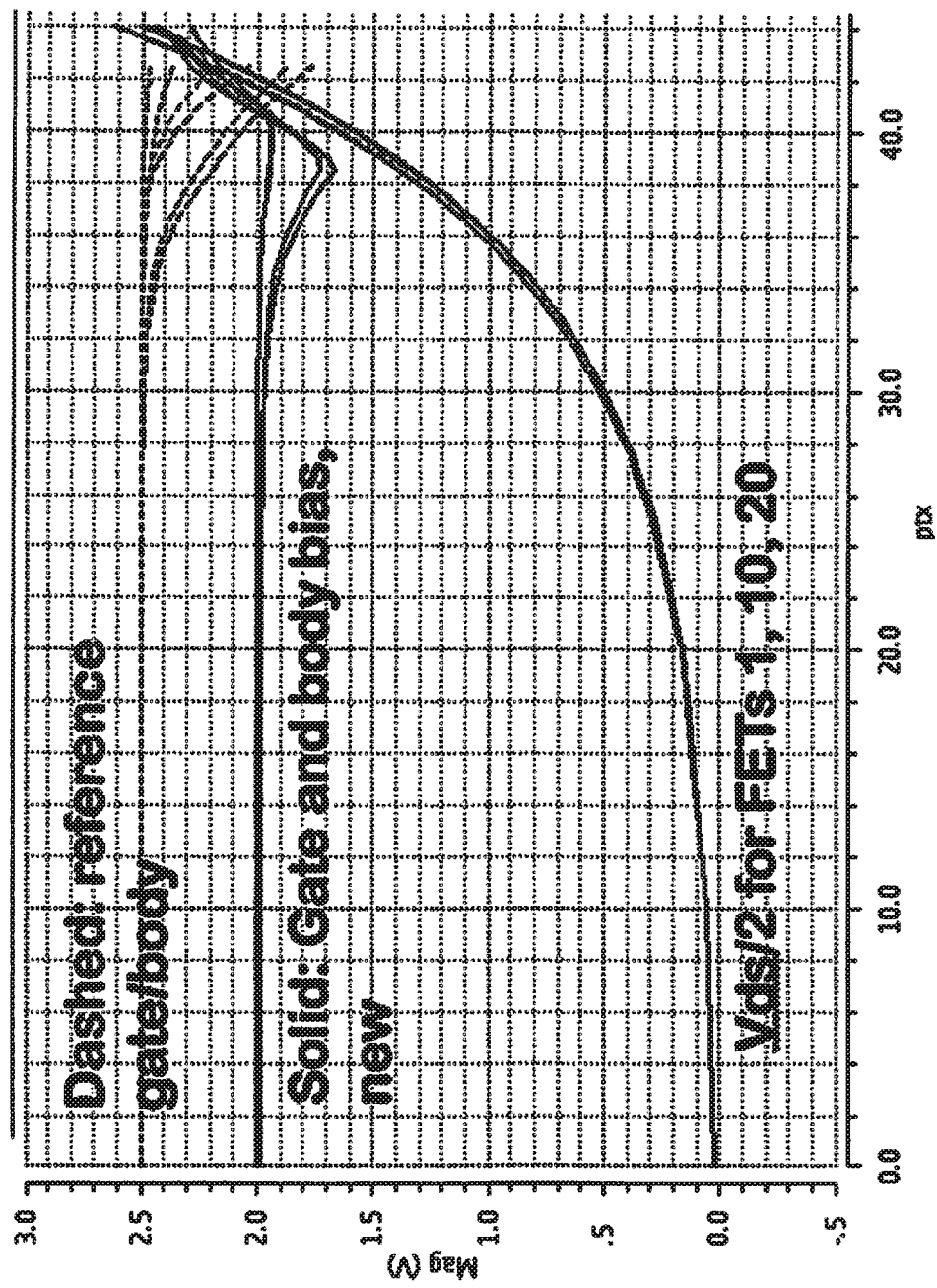
FIGS. 11A and 11B are graphs of simulation results of an RF switch comprised of stages having a circuit for providing local body bias according to an embodiment of the subject matter described herein.
Figure 11B:
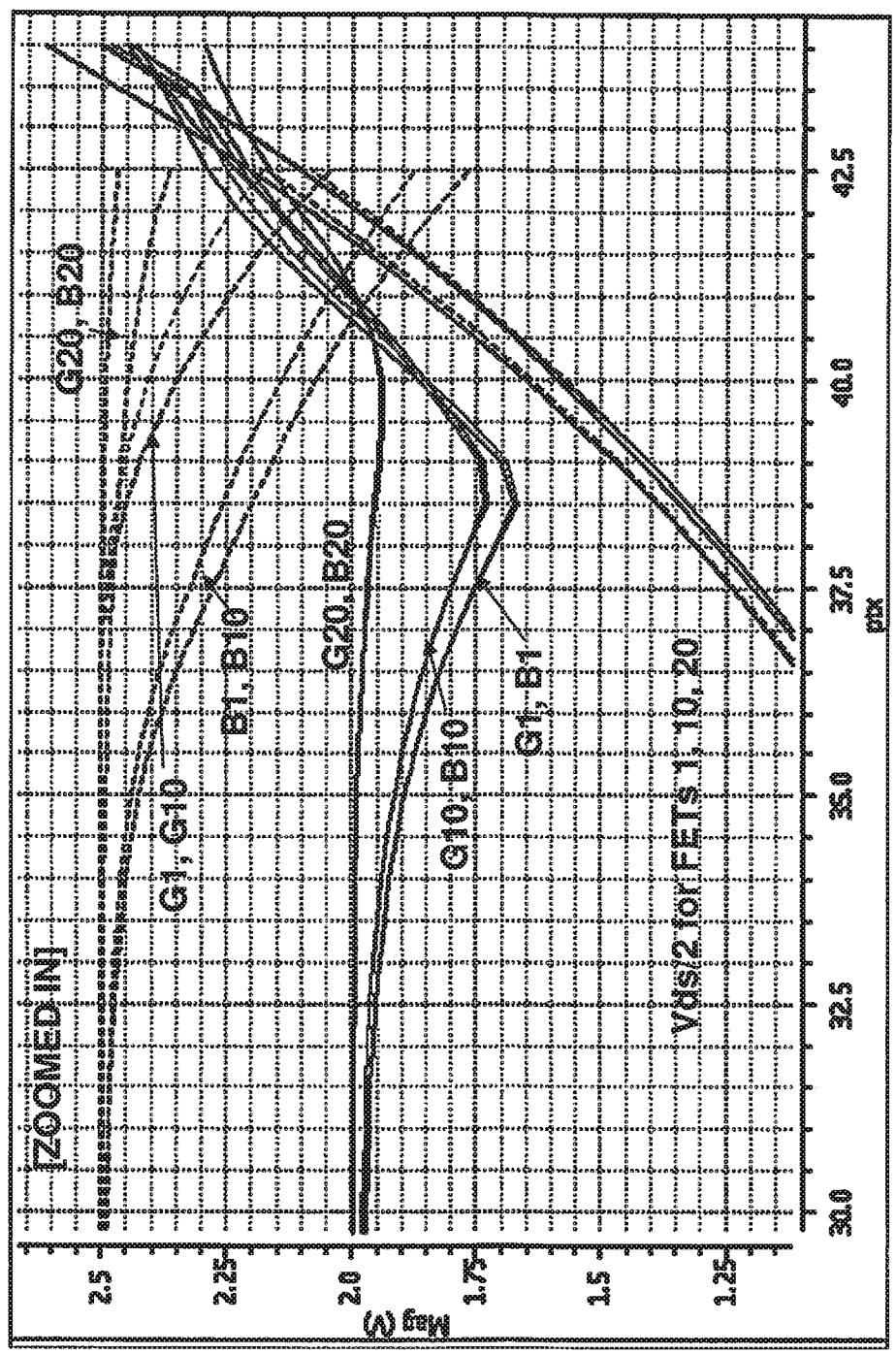

FIGS. 11A and 11B are graphs of simulation results of an RF switch comprised of stages having a circuit for providing local body bias according to an embodiment of the subject matter described herein. FIG. 11B is a portion of the graph in FIG. 11A, magnified to show detail. FIGS. 11A and 11B are plots of a simulation result from a shunt branch comprising multiple instances of the stage 22 in FIG. 6 versus a shunt branch comprising the same number of instances of a conventional stage. A periodic steady-state simulation was performed for swept power levels indicated on the x-axis in units of decibel-milliwatts. The y-axis is in units of voltage. The DC bias applied to the gate and body of the conventional stages is −2.5 V, while the DC bias applied to the gate and body of the improved stages is −2.0 V, so that the two sets of plots would be separated for easier viewing and comparison. (It should be noted that the results described below for the improved stages would be the comparable with application of a −2.5V DC bias.)

In FIG. 11A, the traces in the lower portion of the graph show peak $V_{DS}$ voltage divided by two in order to show how they approach the gate and body voltages; the gate and body voltages are floating relative to $V_{DS}/2$. The two sets of traces in the upper portion of the graph show the absolute value of DC gate and body voltages (the actual gate and body voltages are negative in this circuit). The upper traces with solid lines show gate and body voltages for a stage that includes the local body bias circuit according to an embodiment of the subject matter described herein, and the upper traces with dashed lines show the gate and body voltages for a conventional stage that does not include a local body bias circuit. It can be seen from FIG. 11A that the presence of the local body bias circuit does not change the values of $V_{DS}$ significantly compared to the conventional stage.

In FIG. 11B, however, the performance of the stage having the local body bias circuit shows marked improvement. For clarity, the voltages for just three of the twenty stages—the 1$^{st}$ stage, the 10$^{th}$ stage, and the 20$^{th}$ stage—are shown. The 1$^{st}$ stage is closest to the RF power input, the 10$^{th}$ stage is in the middle of the branch, and the 20$^{th}$ stage is closest to ground.

Looking at the dashed lines in the upper portion of the graph in FIG. 11B, which represent the performance of a conventional stage, it can be seen that when ptx>32 dBm, the body and gate voltages begin to drop. This is because the body current causes a voltage drop in the resistors and de-biases the body and gate. Once the body voltage or gate voltage drops below $V_{DS}/2$, the stage (and switch) will no longer operate. For the conventional stages, this occurs at approximately 41 dBm.

In contrast, the solid lines in the middle portion of the graph in FIG. 11B, which represent the performance of the stage having a local body bias circuit according to an embodiment of the subject matter described herein, show a similar drop, but only until $V_{DS}$ reaches about 1.65V (ptx is about 38.5 dBm), at which point the local body bias circuit begins to operate. As ptx increases, $V_{DS}$ increases; as $V_{DS}$ increases, the rectifier circuit begins to drive the body bias more and more strongly negative. This is most clearly evident in the solid line labeled "G1, B1": as ptx increases above 38.5 dBm, the magnitude of these voltages continues to increase with the result that they continue to stay above $V_{DS}/2$ beyond the 41 dBm limit of the conventional circuit.

Additional simulation results were performed as summarized using the same FET and resistor sizes:

TABLE 2

Additional Simulation Results

| Item tested | Result |
| --- | --- |
| Q versus input power | Q is not degraded by the body rectification circuit for low power, up to the power at which the circuit begins to inject current into the body node. |
| Time response of the body rectification circuit | A transient simulation was performed in which the RF power level was abruptly increased. The body rectification circuit was able to follow this increased power level in less than 0.1 µs, settling in <0.5 µs. |
| Harmonics | Neither on-nor off state harmonics were affected by this circuit. |
| Figure of Merit | Figure of merit is increased (degraded) by approximately 10% with this circuit. |
| Off state Q | Off state Q is degraded by 20% with this circuit. |
| Voltage handling | Voltage handing is improved by 20 V with this circuit. |

Note that when comparing circuits with identical voltage handling, this circuit has improved Q. In addition, performance could be adjusted for higher $V_B$ and tuned for harmonics and $C_{off}$.

Figure 12:
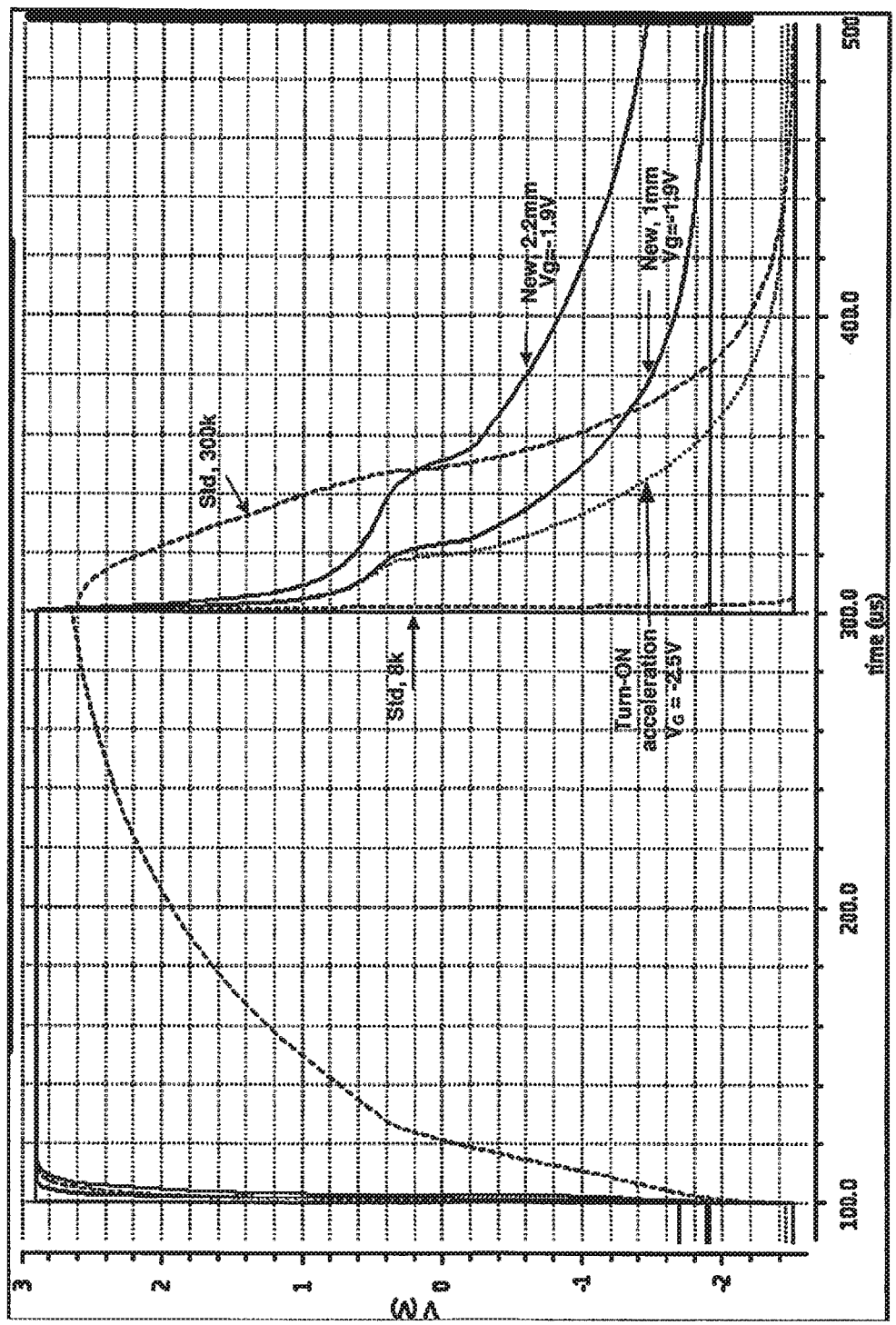
FIG. 12 is a graph showing response time of a switch having stages according to embodiments of the subject matter described herein.

FIG. 12 is a graph showing response time of a switch having stages according to embodiments of the subject matter described herein. FIG. 12 is a plot that shows the $V_G$ of the first FET in a stack. Bias is connected to the last FET in a stack of 20, so the first FET is the slowest to respond. FIG. 12 demonstrates that gate-shorting FETs are effective in reducing the off-to-on transient, and also help shorten the on-to-off transient up to the transistor threshold (this is approximately the small-signal switching time). For fast on-to-off large signal switching time, use higher $V_{Goff}$ (or higher $|V_{Goff}|$ for a limited time to overdrive gate low), and/or use a smaller gate resistor. Note that with a body boost circuit and large input signal, body bias goes low faster than the DC bias network. In FIG. 12, voltages labeled "Std" are for switches with conventional stages (i.e., no switching acceleration, no local body bias circuit); voltages labeled "Turn-on acceleration" are for switches with turn-on switching acceleration networks according to an embodiment of the subject matter described herein (e.g., the stage 14 in FIG. 3A and similar); and voltages labeled "New" are for switches having turn-on switching acceleration networks and local body bias circuits (e.g., the stage 22 in FIG. 6 and similar).

Simulations of stages according to embodiments of the subject matter disclosed herein demonstrated that on state harmonics are similar to conventional stage designs, that the extra components of the improved stages are mostly shorted out and have little effect. There is only a 2 dB difference in H2; H4 and H5 levels were very low, very similar to conventional stages.

Regarding the comparison of stages having acceleration networks only versus stages that also included the local body bias circuit, simulations indicate the following: the latter has lower off state H2 due to high resistor values; the latter has much lower off state H3 due to gate/body linearization varactors circuits; the latter has much higher H4 and H5 in simulation, but still at very low levels; and finally, that, compared to the relatively smooth response curves of the former, the latter's response curves are "bumpy," due to the effects of the gate resistor bypass switches at low power and the effects of the gate linearization circuit bias change at 37 dBm and higher power levels.

FIG. 13 is a table comparing values for reference designs and various embodiments according to the subject matter disclosed herein. It was determined that $V_G$ affects $C_{off}$ and that there is a trade-off between $C_{off}$ and $V_{BD}$.

The following was found in regard to reliability. The diodes in the local body bias circuit can be subject to relatively high reverse bias, for example, -2.5-4 V=-6.5 V. This may be too high for a reliable gate oxide for some types of gated diode, which may or may not have a floating gate. Depending on the particular structure used, this high field may be divided across source-gate and drain-gate areas of the layout, or it may be concentrated only in the drain-gate area. The contact space for a gated diode may be significantly smaller than for a non-gated diode, which affects layout and density. A diode-connected FET is similar to a gated diode with a connected gate, but may not be able to support a high reverse bias of 6.5 V. In the processes studied, non-gated diodes were found to have the lowest on-resistance, while diode-connected FET were found to have the lowest turn-on voltage (0.4 V versus 0.75V for 1 μA).

Those skilled in the art will recognize improvements and modifications to the present disclosure. All such improvements and modifications are considered within the scope of the concepts disclosed herein.

What is claimed is:

1. A radio frequency (RF) switch, comprising:
one or more stages, each stage comprising:
a signal input terminal;
a signal output terminal;
a control input terminal;
a switching device having a first terminal connected to the signal input terminal, a second terminal connected to the signal output terminal, and a third terminal for controlling an on/off state of the switching device;
a first resistor connected in series between the control input terminal and the third terminal;
a first bypass switch for connecting each end of the first resistor to bypass the first resistor when the first bypass switch is closed;
a second resistor connected in series between the signal input terminal and the signal output terminal; and
a second bypass switch for connecting each end of the second resistor to bypass the second resistor when the second bypass switch is closed;
wherein the first bypass switch and the second bypass switch are configured to close concurrently to collectively reduce a respective time constant set by the first resistor and the second resistor;
the one or more first resistors forming a first bias network and the one or more second resistors forming a second bias network.

2. The switch of claim 1 wherein for at least one stage, the first bypass switch operates to bypass the first resistor when the switching device is in the on state and does not operate to bypass the first resistor when the switching device is in the off state.

3. The switch of claim 1 wherein for at least one stage, the first bypass switch comprises a plurality of switching devices in series.

4. The switch of claim 1 wherein the second bypass switch operates to bypass the second resistor when the switching device is in the on state and does not operate to bypass the second resistor when the switching device is in the off state.

5. The switch of claim 1 wherein a control signal for the second bypass switch is derived from a control signal of the first bypass switch.

6. The switch of claim 1 wherein a control signal for the second bypass switch is independent from a control signal of the first bypass switch.

7. The switch of claim 1 wherein at least one stage further comprises at least one diode connected in series between the second terminal and the control input terminal to provide a discharge path from the second terminal to the control input terminal.

8. The switch of claim 7 wherein the second terminal is connected to an anode of one of the at least one diode and wherein the control input terminal is connected to a cathode of one of the at least one diode.

9. The switch of claim 1 wherein, for at least one stage, the switching device comprises a field-effect transistor (FET), the first terminal comprising a source terminal of the FET, the second terminal comprising a drain terminal of the FET, the third terminal comprising a gate terminal of the FET.

10. The switch of claim 9 wherein the FET further comprises a body terminal connected to the body of the FET.

11. The switch of claim 10 wherein at least one stage further comprises a first body switch for connecting the source terminal of the FET to the body terminal of the FET when closed and a second body switch for connecting the drain terminal of the FET to the body terminal of the FET when closed.

12. The switch of claim 11 wherein the first body switch comprises one or more switching devices in series.

13. The switch of claim 11 wherein the second body switch comprises one or more switching devices in series.

14. The switch of claim 10 wherein at least one stage further comprises a third body switch for connecting the gate terminal of the FET to the body terminal of the FET when closed.

15. The switch of claim 14 wherein the third body switch comprises one or more switching devices in parallel.

16. The switch of claim 11 wherein, for the at least one stage, the first body switch and the second body switch also operate as an acceleration network.

17. The switch of claim 1 wherein at least one stage further comprises at least one diode connected in series between a source terminal or a drain terminal and a body terminal to provide a discharge path from the source terminal or drain terminal to the body terminal.

18. The switch of claim 1 comprising a plurality of the stages, wherein the switching devices of the plurality of stages are connected in series.

19. The switch of claim 1 further providing a pulsed control signal to the third terminal of at least one stage, wherein the pulsed control signal is not active for all of the time that the switching device is on.

\* \* \* \* \*